United States Patent
Iwaki et al.

(10) Patent No.: US 8,305,159 B2
(45) Date of Patent: Nov. 6, 2012

(54) PIEZOELECTRIC THIN FILM RESONATOR, FILTER USING THE RESONATOR, DUPLEXER USING THE FILTER, AND COMMUNICATION EQUIPMENT USING THE FILTER OR THE DUPLEXER

(75) Inventors: Masafumi Iwaki, Kawasaki (JP); Tokihiro Nishihara, Kawasaki (JP); Masanori Ueda, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 79 days.

(21) Appl. No.: 12/707,301

(22) Filed: Feb. 17, 2010

(65) Prior Publication Data
US 2010/0141353 A1    Jun. 10, 2010

Related U.S. Application Data

(63) Continuation of application No. PCT/JP2007/066474, filed on Aug. 24, 2007.

(51) Int. Cl.
*H03H 9/15* (2006.01)
*H03H 9/54* (2006.01)
*H03H 9/70* (2006.01)

(52) U.S. Cl. ........ 333/133; 333/187; 333/189; 310/322; 310/365

(58) Field of Classification Search ............. 333/187, 333/189, 188, 133; 310/322, 325, 326, 365
See application file for complete search history.

(56) References Cited

U.S. PATENT DOCUMENTS

| | | | |
|---|---|---|---|
| 5,717,366 A * | 2/1998 | Ozeki et al. | 333/189 |
| 6,215,375 B1 * | 4/2001 | Larson et al. | 333/187 |
| 6,657,363 B1 * | 12/2003 | Aigner | 310/324 |
| 6,662,419 B2 * | 12/2003 | Wang et al. | 29/25.35 |
| 6,788,170 B1 | 9/2004 | Kaitila et al. | |
| 6,812,619 B1 | 11/2004 | Kaitila et al. | |
| 6,842,089 B2 * | 1/2005 | Lee | 333/189 |
| 7,280,007 B2 | 10/2007 | Feng et al. | |

(Continued)

FOREIGN PATENT DOCUMENTS
EP    0 973 256 A1    1/2000
(Continued)

OTHER PUBLICATIONS

Japanese Office Action dated Apr. 12, 2012, in a counterpart Japanese patent application No. 2009-529878.

(Continued)

*Primary Examiner* — Barbara Summons
(74) *Attorney, Agent, or Firm* — Chen Yoshimura LLP

(57) ABSTRACT

There is provided a piezoelectric thin film resonator that decreases only transverse mode waves selectively while maintaining resonance characteristics due to original thickness longitudinal vibration. The piezoelectric thin film resonator includes: a piezoelectric film (14); a first electrode (15a) formed on a first principal surface of the piezoelectric film (14); and a second electrode (13) formed on a second principal surface of the piezoelectric film (14) opposite to the first principal surface. The resonator has a resonance region (20) where the first electrode (15a) and the second electrode (13) are opposed to each other. An electrically discontinuous portion (18a) that is insulated from the first electrode (15a) is provided on the first principal surface of the piezoelectric film (14) in the resonance region (20), and the electrically discontinuous portion (18a) is surrounded by the first electrode (15a) on the first principal surface.

13 Claims, 22 Drawing Sheets

U.S. PATENT DOCUMENTS

| | | | |
|---|---|---|---|
| 7,489,063 B2 * | 2/2009 | Isobe et al. ............ | 310/312 |
| 2002/0014808 A1 | 2/2002 | Misu et al. | |
| 2002/0079986 A1 | 6/2002 | Ruby et al. | |
| 2004/0251987 A1 | 12/2004 | Nakamura et al. | |
| 2006/0071736 A1 | 4/2006 | Ruby et al. | |
| 2006/0103492 A1 | 5/2006 | Feng et al. | |
| 2006/0226932 A1 | 10/2006 | Fazzio et al. | |
| 2007/0080611 A1 | 4/2007 | Yamada et al. | |
| 2007/0205850 A1 | 9/2007 | Jamneala et al. | |

FOREIGN PATENT DOCUMENTS

| | | |
|---|---|---|
| EP | 1 196 989 A1 | 4/2002 |
| GB | 2 418 791 A | 4/2006 |
| JP | 61-258518 A | 11/1986 |
| JP | S63-187713 A | 8/1988 |
| JP | 5-40583 Y2 | 7/1989 |
| JP | 9-238045 A | 9/1997 |
| JP | H10-32454 A | 2/1998 |
| JP | 2002-223144 A | 8/2002 |
| JP | 2003-505906 A | 2/2003 |
| JP | 2003-124779 A | 4/2003 |
| JP | 2004-32132 A | 1/2004 |
| JP | 2004-343735 A | 12/2004 |
| JP | 2006-50021 A | 2/2006 |
| JP | 2006-109472 A | 4/2006 |
| JP | 2006-295924 A | 10/2006 |
| JP | 2007-6501 A | 1/2007 |
| JP | 2007-67485 A | 3/2007 |
| JP | 2007-110281 A | 4/2007 |
| WO | WO 99/37023 A1 | 7/1999 |
| WO | WO 01/06646 A1 | 1/2001 |
| WO | WO 01/06647 A1 | 1/2001 |

OTHER PUBLICATIONS

Japanese Office Action dated Aug. 16, 2012, in a counterpart Japanese patent application No. 2009-529878.

* cited by examiner

PIEZOELECTRIC THIN FILM RESONATOR, FILTER USING THE RESONATOR, DUPLEXER USING THE FILTER, AND COMMUNICATION EQUIPMENT USING THE FILTER OR THE DUPLEXER

FIELD

The present application relates to a piezoelectric thin film resonator, a filter, a duplexer, and communication equipment.

BACKGROUND

In recent years, piezoelectric thin film resonators using thickness longitudinal vibration of a piezoelectric material have been attracting attention as a component of a filter for high-frequency communication. The piezoelectric thin film resonators include a FBAR (Film Acoustic Bulk Resonator), a SMR (Solidly Mounted Resonator), and the like.

SUMMARY

A first piezoelectric thin film resonator according to the present application includes: a piezoelectric film; a first electrode formed on a first principal surface of the piezoelectric film; and a second electrode formed on a second principal surface of the piezoelectric film opposite to the first principal surface. The resonator has a resonance region where the first electrode and the second electrode are opposed to each other. In order to solve the above-described problem, an electrically discontinuous portion that is insulated from the first electrode is provided on the first principal surface of the piezoelectric film in the resonance region, and the electrically discontinuous portion is surrounded by the first electrode on the first principal surface.

A second piezoelectric thin film resonator according to the present application includes: a piezoelectric film; a first electrode formed on a part of a first principal surface of the piezoelectric film; and a second electrode formed on a second principal surface of the piezoelectric film opposite to the first principal surface. The resonator has a resonance region where the first electrode and the second electrode are opposed to each other. In order to solve the above-described problem, an electrically discontinuous portion is provided on the first principal surface of the piezoelectric film in an area where the first electrode is not opposed to the second electrode, and the electrically discontinuous portion is arranged in contact with the first electrode and insulated from the first electrode.

A filter according to the present application has a plurality of the above-described piezoelectric thin film resonators. With this configuration, since each of the piezoelectric thin film resonators achieves a reduction in spurious, the filter is allowed to have a lower EVM.

A duplexer according to the present application includes: a transmission filter; and a reception filter that allows a signal in a frequency band different from that of the transmission filter to pass therethrough. The transmission filter and the reception filter have the above-described filter.

Communication equipment according to the present application includes: an antenna; the above-described duplexer connected to the antenna; and a signal processor connected to the duplexer. Since the above-described filter has a low EVM, the filter achieves a reduction in insertion loss at frequencies where a large loss has been caused by spurious, and is operated with a smaller amount of power of signals passing therethrough. Thus, the communication equipment is driven with a smaller amount of power for a longer time.

Additional objects and advantages of the invention (embodiment) will be set forth in part in the description which follows, and in part will be obvious from the description, or may be learned by practice of the invention. The object and advantages of the invention will be realized and attained by means of the elements and combinations particularly pointed out in the appended claims, It is to be understood that both the foregoing general description and the following detailed description are exemplary and explanatory only and are not restrictive of the invention, as claimed.

DESCRIPTION OF EMBODIMENT(S)

Figure 1:
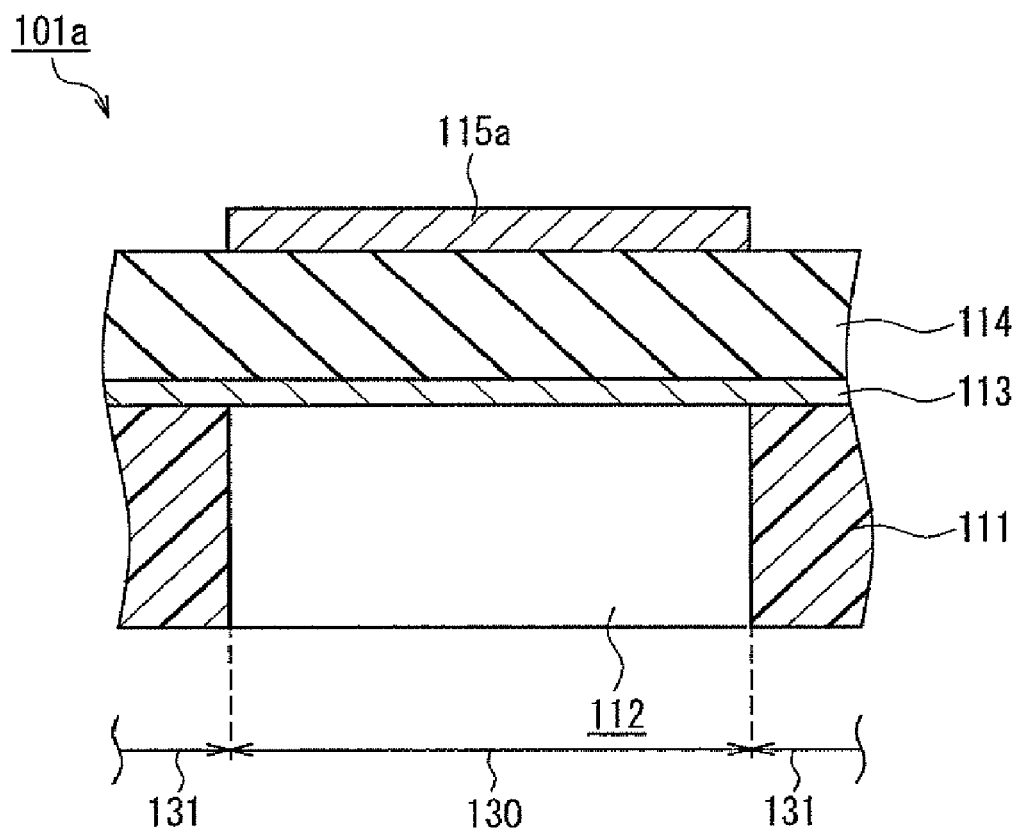
FIG. 1 is a cross-sectional view illustrating a configuration of a conventional FBAR.

FIG. 1 is a cross-sectional view illustrating a configuration of a conventional FBAR 101a. A substrate 111 includes a gap 112. A lower electrode 113 is formed on the substrate 111 so as to cover the gap 112. A piezoelectric film 114 is formed on the lower electrode 113. An upper electrode 115a is formed on the piezoelectric film 114. A region (hereinafter, referred to as a resonance region) 130 where the lower electrode 113 and the upper electrode 115a are opposed to each other serves as a practical resonator. Since the substrate 111 includes the gap 112 in the resonance region 130, acoustic waves generated in the piezoelectric film 114 are not attenuated, resulting in resonance characteristics with a high Q value. It should be noted that a SMR has a configuration in which an acoustic reflection film is provided in place of the gap 112, which results in resonance characteristics with a high Q value as in the case of the FBAR.

Figure 2:
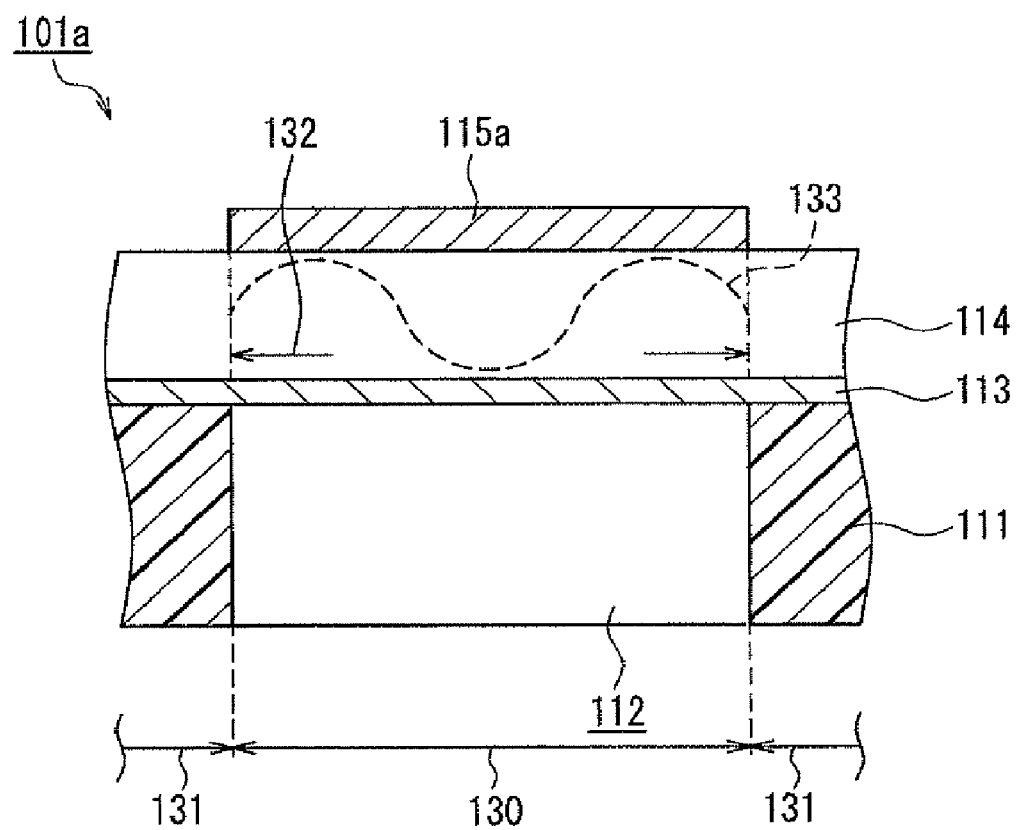
FIG. 2 is a cross-sectional view illustrating the configuration of the conventional FBAR for explaining transverse waves when a high-frequency voltage is applied to the FBAR.

The acoustic waves to be used in the FBAR 101a are longitudinal waves (thickness longitudinal vibration, piston mode) that propagate between the lower electrode 113 and the upper electrode 115a in a direction normal to a surface of the upper electrode 115a. In addition to these, waves (hereinafter, referred to as transverse waves) that propagate in a direction (hereinafter, referred to as a lateral direction) vertical to the direction normal to the surface of the upper electrode 115a also are generated. FIG. 2 is a cross-sectional view of the FBAR 101a. In order to illustrate transverse waves 132 and standing waves 133, the piezoelectric film 114 is not hatched. The transverse waves 132 are reflected from a boundary between the resonance region 130 and a region (non-resonance region) 131 outside thereof, and become the standing waves (transverse mode) 133.

Figure 3A:
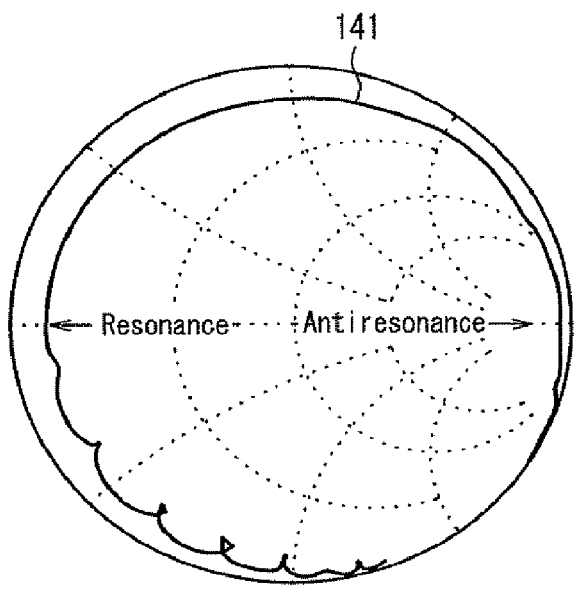
FIG. 3A is a Smith chart illustrating complex impedance of the conventional FBAR.
Figure 3B:
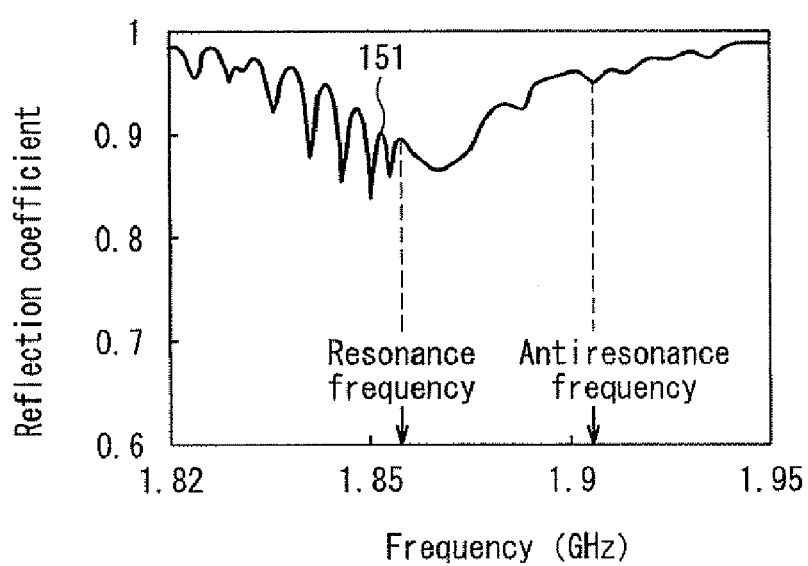
FIG. 3B is a graph illustrating frequency characteristics of a reflection coefficient of the conventional FBAR.

FIG. 3A is a Smith chart illustrating complex impedance characteristics 141 of the FBAR 101a illustrated in FIG. 1. FIG. 3B is a graph illustrating frequency characteristics 151 of a reflection coefficient of the FBAR 101a. The characteristics 141 illustrated in FIG. 3A and the characteristics 151 illustrated in FIG. 3B show the occurrence of spurious at frequencies lower than a resonance frequency. This spurious is caused by the transverse mode waves.

Figure 4:
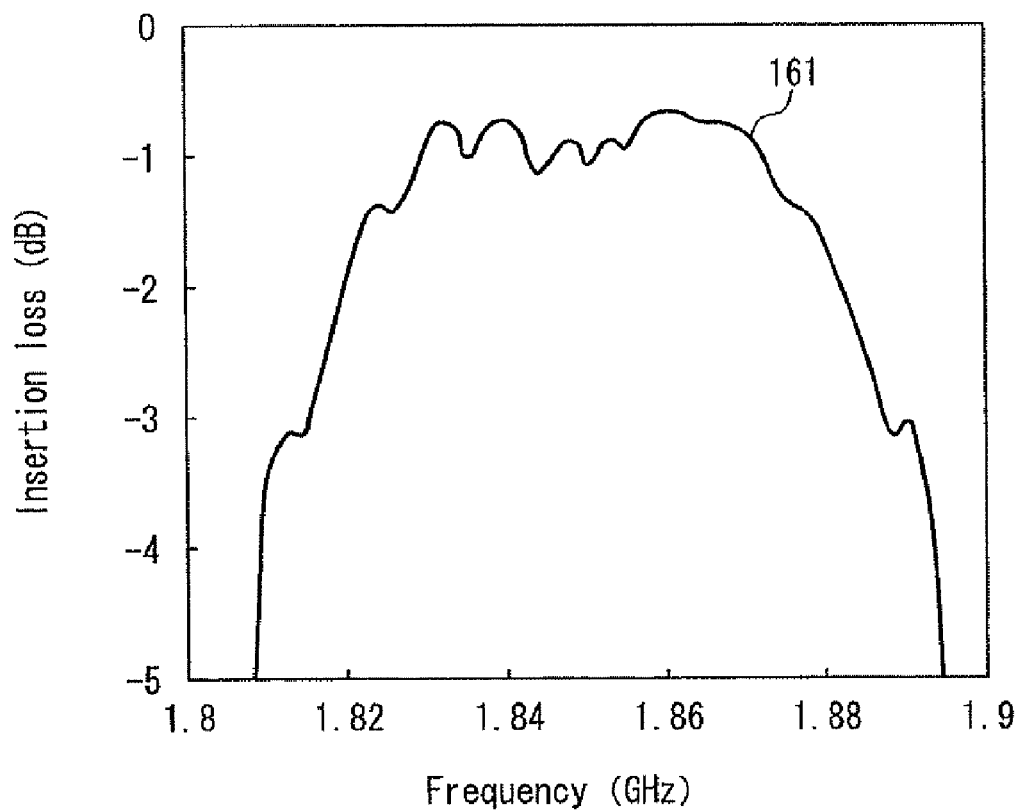
FIG. 4 is a graph illustrating insertion loss frequency characteristics of a ladder-type filter using the conventional FBAR.

FIG. 4 is a graph illustrating insertion loss characteristics 161 of a ladder-type filter using the FBAR 101a for a serial arm and a parallel arm. A point of increased loss (spurious) occurs periodically particularly in a central region (frequency band of 1.83 to 18.6 GHz) of a passband (1.81 to 1.89 GHz).

The characteristics 161 of the ladder-type filter are affected by the characteristics of the FBAR arranged in the serial arm at frequencies lower than an antiresonance frequency. Thus, when the FBAR 101a having the characteristics 151 illustrated in FIG. 3B is arranged in the serial arm, the spurious of the FBAR 101a appears as the spurious of the ladder-type filter in the passband as illustrated in FIG. 4.

This spurious deteriorates main characteristics of the filter such as a VSWR (Voltage Standing Wave Ratio), an EVM (Error Vector Magnitude), and an insertion loss.

Figure 5:
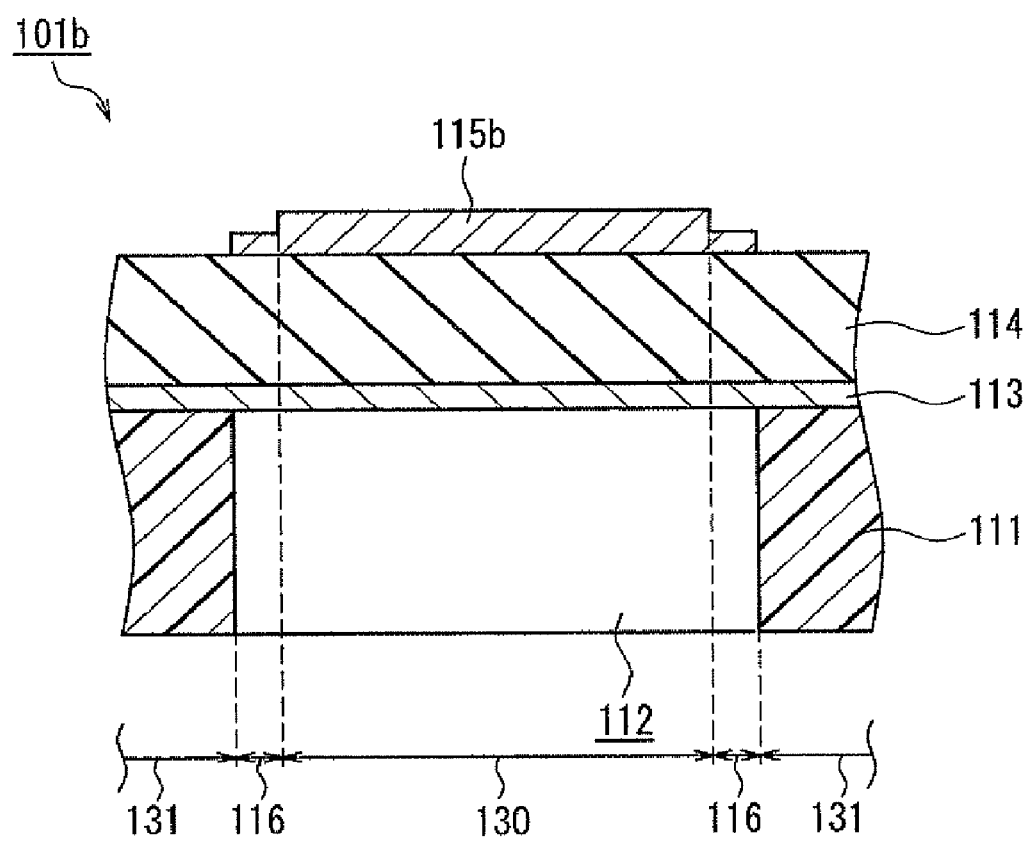
FIG. 5 is a cross-sectional view illustrating a configuration of another conventional FBAR.

In order to reduce the spurious, a method of decreasing the transverse mode waves of the FBAR has been proposed conventionally. For example, there is a FBAR 101b, as illustrated in a cross-sectional view of FIG. 5, in which a portion (end region) 116 having a thickness smaller than that of an upper electrode 115b is provided at an end of the upper electrode 115b, so that acoustic characteristics in the end region 116 are different from those in the resonance region 130 and the non-resonance region 131 (see, for example, JP 2003-505906A and JP 2006-109472A).

Figure 6A:
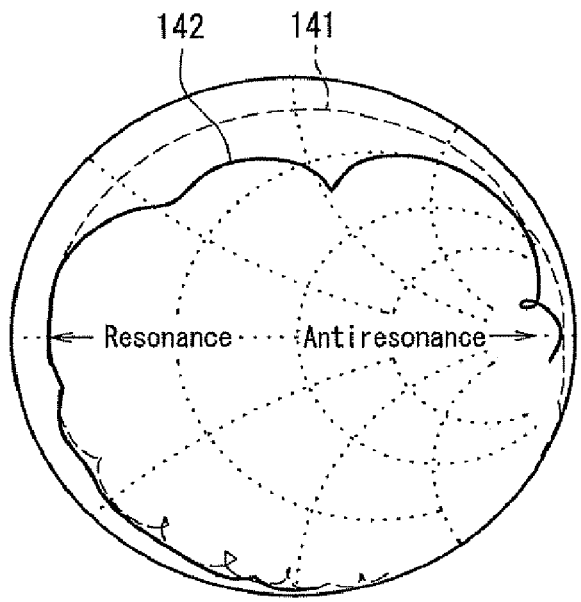
FIG. 6A is a Smith chart illustrating complex impedance of the other conventional FBAR.
Figure 6B:
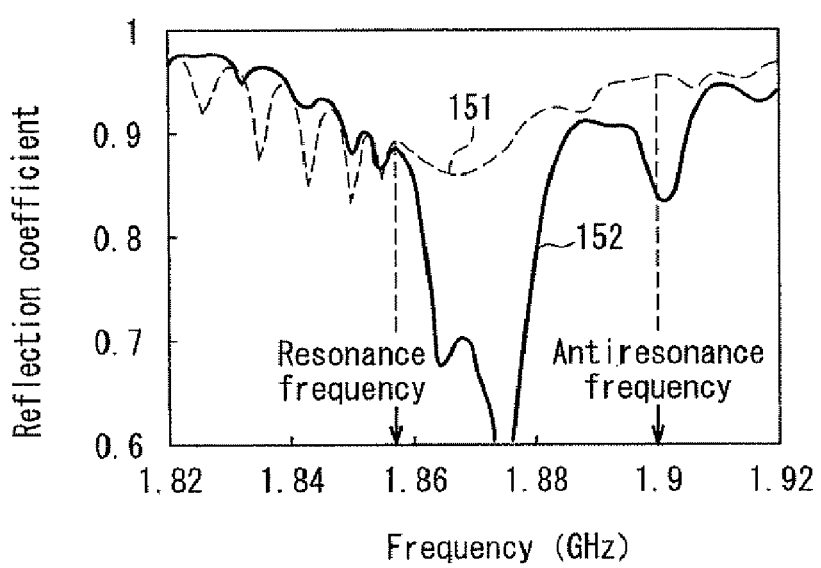
FIG. 6B is a graph illustrating frequency characteristics of a reflection coefficient of the other conventional FBAR.

With this configuration, the transverse waves are reflected from a boundary between the resonance region 130 and the end region 116 and a boundary between the non-resonance region 131 and the end region 116, and interfere to be weakened each other. As a result, the piston mode waves as principal vibration become predominant, while the transverse mode waves are decreased. Although the above-described documents do not show any specific exemplary characteristics, frequency-complex impedance characteristics of this structure can be calculated by using general-purpose piezoelectric analysis software. FIG. 6A is a Smith chart illustrating complex impedance characteristics 142 of the FBAR 101b. FIG. 6B is a graph illustrating frequency characteristics 152 of a reflection coefficient of the FBAR 101b. In FIGS. 6A and 6B, the characteristics 141 and 151 of the FBAR 101a illustrated in FIGS. 3A and 3B are indicated by broken lines for comparison. As can be seen from FIGS. 6A and 6B, the spurious at frequencies lower than the resonance frequency is reduced in the FBAR 101b as compared with the FBAR 101a.

Figure 7:
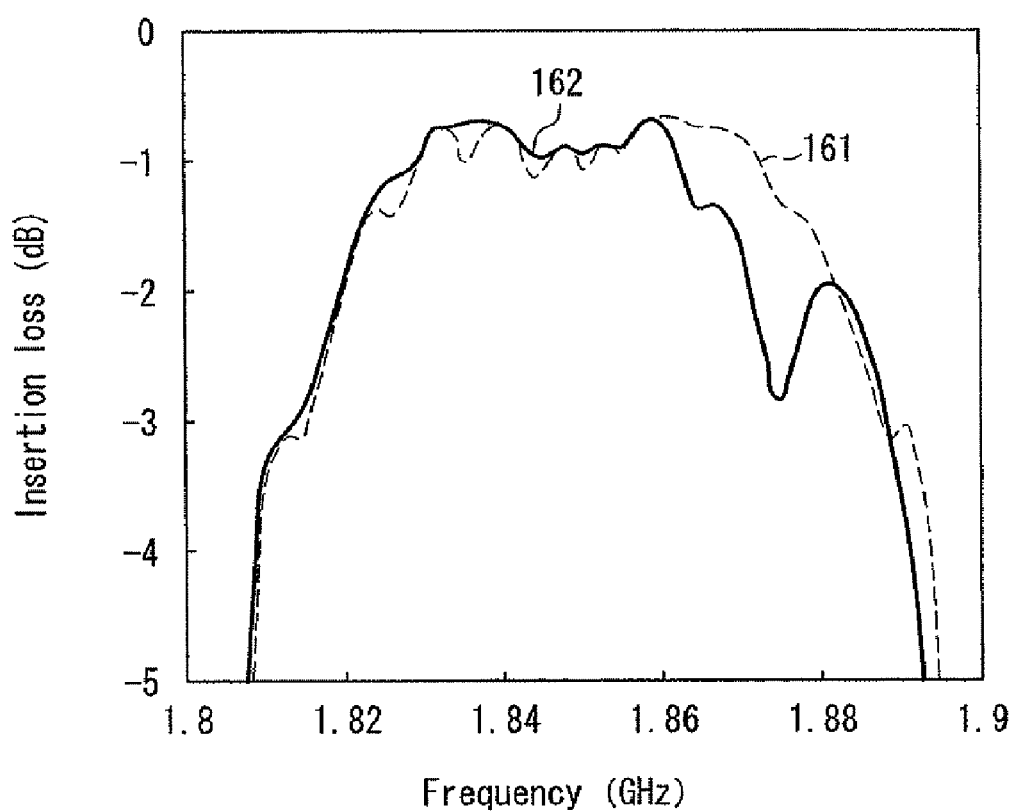
FIG. 7 is a graph illustrating insertion loss frequency characteristics of a ladder-type filter using the other conventional FBAR.

However, as illustrated in FIG. 6B, the reflection coefficient of the above-described conventional FBAR 101b is decreased in a region (1.86 to 1.88 GHz) between the resonance frequency and the antiresonance frequency. FIG. 7 is a graph illustrating insertion loss frequency characteristics 162 of a ladder-type filter using the FBAR 101b. As compared with the characteristics 161 of the ladder-type filter using the FBAR 101a indicated by a broken line, the characteristics 162 of the ladder-type filter using the FBAR 101b show a reduction in spurious in the central region of the passband and in a low frequency region (frequency band of 1.82 to 1.86 GHz), leading to an improvement in insertion loss of about 0.2 to 0.3 dB. However, the insertion loss is increased by about 2 dB at higher frequencies (1.86 to 1.88 GHz).

This results from the fact that the reflection coefficient of the FBAR 101b is decreased in the region between the resonance frequency and the antiresonance frequency due to the presence of the end region 116. That is, with the configuration of the FBAR 101b, it is difficult to reduce spurious due to the transverse mode waves selectively, while maintaining the characteristics 151 of the FBAR 101a, i.e., resonance characteristics due to original thickness longitudinal vibration.

A first piezoelectric thin film resonator according to the present application includes: a piezoelectric film; a first electrode formed on a first principal surface of the piezoelectric film; and a second electrode formed on a second principal surface of the piezoelectric film opposite to the first principal surface. The resonator has a resonance region where the first electrode and the second electrode are opposed to each other. In order to solve the above-described problem, an electrically discontinuous portion that is insulated from the first electrode is provided on the first principal surface of the piezoelectric film in the resonance region, and the electrically discontinuous portion is surrounded by the first electrode on the first principal surface.

The piezoelectric thin film resonator with this configuration generate transverse waves in addition to piston mode waves when a high-frequency voltage is applied between the first electrode and the second electrode. On the other hand, the electrically discontinuous portion, which is insulated from the first electrode, is not subjected to the high-frequency voltage. Thus, the transverse waves generated in the piezoelectric film in the resonance region on both sides of the electrically discontinuous portion cancel each other in the piezoelectric film below the electrically discontinuous portion. As a result, the transverse waves are less reflected from an end of the resonance region, so that transverse standing waves generated due to the transverse waves are decreased, resulting in a reduction in spurious.

In the first piezoelectric thin film resonator according to the present application, the electrically discontinuous portion can include: a simulated electrode; and an insulating portion that insulates the first electrode from the simulated electrode. The insulating portion may be made of an insulating material or formed of a gap.

Further, the simulated electrode can have the same surface density as the first electrode. With this configuration, the piezoelectric film is subjected to the same pressure below the first electrode and below the simulated electrode, and thus has the same acoustic characteristics. Accordingly, the transverse waves are not reflected from a boundary between the piezoelectric film below the first electrode and the piezoelectric film below the simulated electrode, but cancel and are weakened each other in the piezoelectric film below the electrically discontinuous portion. The surface density as used herein refers to the weight of what is designated (electrode) per unit area. Here, the same surface density allows for variations caused during film production, and indicates that the surface density of the upper electrode may be in a range of 95% to 105% of the surface density of the simulated electrode, for example.

Further, the simulated electrode can have the same density as a material of the first electrode. With this configuration, when the simulated electrode and the first electrode have the same surface density, a top surface of the simulated electrode is arranged in the same plane as a top surface of the first electrode. Thus, in the case of forming a dielectric film on the simulated electrode and the first electrode, for example, it is not necessary to form a flattening film or the like.

Further, the following expression can be satisfied: $0<g<3\lambda$, where g denotes a distance from an end of the resonance region to the electrically discontinuous portion, and $\lambda$ denotes a wavelength at a resonance frequency. When the distance g from the end of the resonance region to the insulating portion is set in this range, the transverse waves cancel and are weakened each other more effectively in the piezoelectric film below the electrically discontinuous portion.

Further, the following expression can be satisfied: $0<w<\lambda$, where w denotes a width of the electrically discontinuous portion, and $\lambda$ denotes a wavelength at a resonance frequency. When the width w of the electrically discontinuous portion is set in this range, the transverse waves cancel each other more effectively in the piezoelectric film below the electrically discontinuous portion.

Further, the resonance region can have an elliptical shape or a polygonal shape, and the electrically discontinuous portion can be arranged inside the end of the resonance region by the distance g so as to form an elliptical shape or a polygonal shape. With this configuration, when the resonance region has an elliptical shape or the like, the transverse waves propagate different distances, preventing waves having a predetermined wavelength from being strengthened mutually, so that spurious is less likely to occur. Accordingly, combined with the effect of canceling the transverse waves in the electrically discontinuous portion, spurious can be reduced further.

A second piezoelectric thin film resonator according to the present application includes: a piezoelectric film; a first electrode formed on a part of a first principal surface of the piezoelectric film; and a second electrode formed on a second principal surface of the piezoelectric film opposite to the first principal surface. The resonator has a resonance region where the first electrode and the second electrode are opposed to each other. In order to solve the above-described problem, an electrically discontinuous portion is provided on the first principal surface of the piezoelectric film in an area where the first electrode is not opposed to the second electrode, and the electrically discontinuous portion is arranged in contact with the first electrode and insulated from the first electrode.

Also with this configuration, when a high-frequency voltage is applied between the first electrode and the second electrode, transverse waves are generated in addition to piston mode waves. However, since the piezoelectric film has the same acoustic characteristics below the electrically discontinuous portion and in the resonance region, the transverse waves are not reflected from a boundary between the piezoelectric film in the resonance region and the piezoelectric film below the electrically discontinuous portion, but propagate to the piezoelectric film below the electrically discontinuous portion. Accordingly, transverse standing waves are decreased in the piezoelectric film below the electrically discontinuous portion, resulting in a reduction in spurious.

Further, in the second piezoelectric thin film resonator, the electrically discontinuous portion can include: a simulated electrode; and an insulating portion that insulates the first electrode from the simulated electrode.

Further, the simulated electrode can have the same surface density as the first electrode. With this configuration, the piezoelectric film is subjected to the same pressure below the first electrode and below the simulated electrode, and thus has more uniform acoustic characteristics. Accordingly, the transverse waves are less reflected from an end of the resonance region, and propagate to the piezoelectric film below the simulated electrode more easily. As a result, transverse standing waves are decreased, resulting in a reduction in spurious.

Further, the simulated electrode can be made of a material having the same density as a material of the first electrode. With this configuration, when the simulated electrode and the first electrode have the same surface density a top surface of the simulated electrode is arranged in the same plane as a top surface of the first electrode. Thus, in the case of forming a dielectric film on the simulated electrode and the first electrode, for example, it is not necessary to form a flattening film or the like.

Further, the piezoelectric film can be made of AlN. Among materials to be used for the piezoelectric film, MN allows acoustic waves to propagate therethrough at a high speed as compared with other piezoelectric film materials. Thus, it is possible to realize a piezoelectric thin film resonator with a preferable Q value.

Further, the first electrode and the second electrode can be made of Ru. Since Ru is a material with high acoustic impedance, it is possible to realize a piezoelectric thin film resonator with a preferable Q value.

A filter according to the present application has a plurality of the above-described piezoelectric thin film resonators. With this configuration, since each of the piezoelectric thin film resonators achieves a reduction in spurious, the filter is allowed to have a lower EVM.

A duplexer according to the present application includes: a transmission filter; and a reception filter that allows a signal in a frequency band different from that of the transmission filter to pass therethrough. The transmission filter and the reception filter have the above-described filter.

Communication equipment according to the present application includes: an antenna; the above-described duplexer connected to the antenna; and a signal processor connected to the duplexer. Since the above-described filter has a low EVM, the filter achieves a reduction in insertion loss at frequencies where a large loss has been caused by spurious, and is operated with a smaller amount of power of signals passing therethrough. Thus, the communication equipment is driven with a smaller amount of power for a longer time.

(Embodiment 1)

Figure 8A:
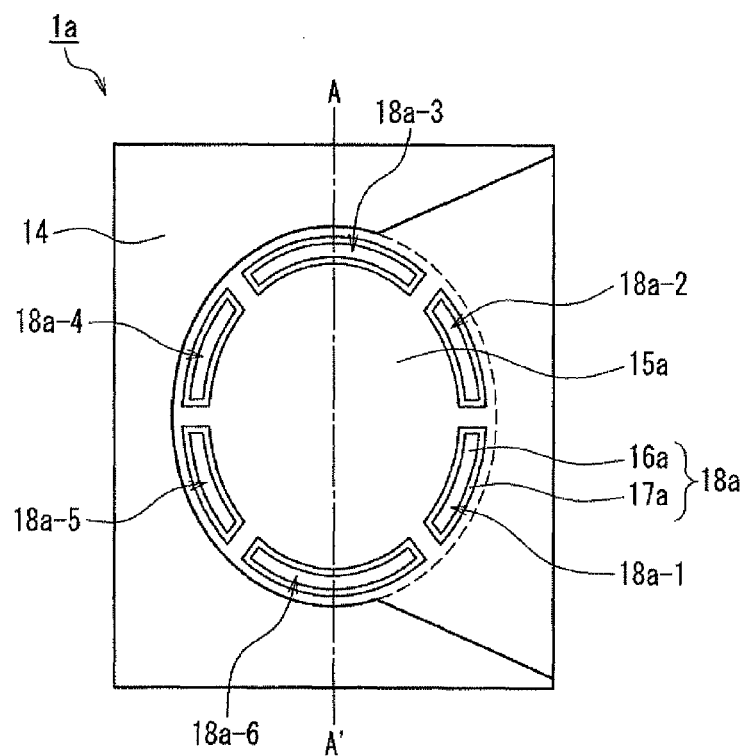
FIG. 8A is a plan view illustrating a configuration of a FBAR according to Embodiment 1 of the present application.
Figure 8B:
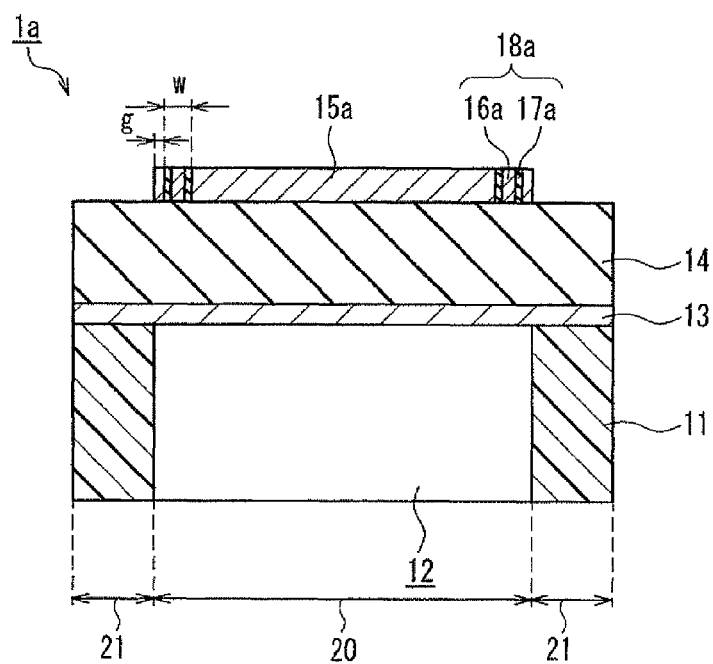
FIG. 8B is a cross-sectional view illustrating the configuration of the FBAR according to Embodiment 1 of the present application, taken along a line A-A'.

FIG. 8A is a plan view illustrating a configuration of a FBAR 1a according to Embodiment 1 of the present application. FIG. 8B is a cross-sectional view taken along a line A-A' in FIG. 8A. A substrate 11 includes a gap 12. A lower electrode 13 (first electrode) is formed on the substrate 11 so as to cover the gap 12. A piezoelectric film 14 is formed on the lower electrode 13. An upper electrode 15a (second electrode) is formed on the piezoelectric film 14. In a resonance region 20, upon application of a predetermined high-frequency voltage, acoustic waves that propagate in a direction normal to a surface of the upper electrode 15a are generated in the piezoelectric film 14 between the upper electrode 15a and the lower electrode 13. In the resonance region 20, each of the lower electrode 13, the piezoelectric film 14, and the upper electrode 15a is formed to have a uniform thickness, so that the piezoelectric film 14 has uniform acoustic characteristics in the resonance region 20. The substrate 11 includes the gap 12 in the resonance region 20. A non-resonance region 21 is a region where the upper electrode 15a and the lower electrode 13 are not opposed to each other. In the non-resonance region 21, no acoustic wave is generated in the piezoelectric film 14 between the upper electrode 15a and the lower electrode 13 upon application of a voltage.

As illustrated in FIG. 8B, the upper electrode 15a includes an electrically discontinuous portion 18a in a portion located inside a boundary (end of the resonance region) between the resonance region 20 and the non-resonance region 21 by a certain distance. The electrically discontinuous portion 18a is insulated from the upper electrode 15a.

As illustrated in FIG. 8A, the electrically discontinuous portion 18a is divided into a plurality of (in FIG. 8A, six) electrically discontinuous portions 18a-1 to 18a-6. The electrically discontinuous portions 18a-1 to 18a-6 are arranged inside the end of the resonance region by a certain distance so as to form an elliptical shape along the end of the resonance region. Each of the electrically discontinuous portions 18a-1 to 18a-6 is spaced from the neighboring electrically discontinuous portions. With this configuration, regions of the upper electrode 15a inside and outside of the electrically discontinuous portion 18a can be brought into conduction.

As illustrated in FIG. 8B, the electrically discontinuous portion 18a includes an insulating portion 17a in contact with the upper electrode 15a, and a simulated electrode 16a made of the same type of metal as the upper electrode 15a. The simulated electrode 16a is surrounded by the insulating portion 17a to be insulated from the upper electrode 15a. Since the simulated electrode 16a is made of the same type of metal as the upper electrode 15a, the piezoelectric film 14 is subjected to the same pressure below the simulated electrode 16a and below the upper electrode 15a, and thus has the same acoustic characteristics below the upper electrode 15a and below the simulated electrode 16a.

Figure 8C:
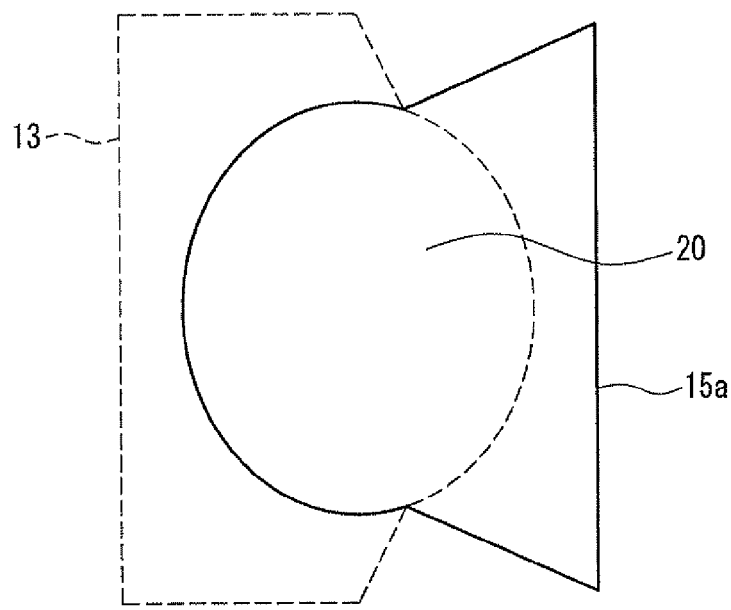
FIG. 8C is a view illustrating a positional relationship between an upper electrode and a lower electrode of the FBAR according to Embodiment 1 of the present application.

FIG. 8C is a view for illustrating a positional relationship between the lower electrode 13 and the upper electrode 15a, which are indicated by a broken line and a solid line, respectively. An outer circumference of the lower electrode 13 includes a portion (elliptic arc portion) formed in an elliptic arc shape. An outer circumference of the upper electrode 15a includes a portion formed in an elliptic arc shape. The upper electrode 15a is arranged so that the elliptic arc portion on its outer circumference and the elliptic arc portion of the lower electrode 13 overlap each other via the piezoelectric film 14 so as to form an elliptical shape. This overlapping region serves as the resonance region 20.

The FBAR 1a is manufactured in the same manner as a conventional FBAR except for an additional process for forming the electrically discontinuous portion 18a. The following description is directed to a process for forming the upper electrode 15a including the formation of the electrically discontinuous portion 18a that is not included in the conventional FBAR. The upper electrode 15a is formed as follows. A metal layer is formed on an entire top surface of the piezoelectric film 14, followed by the removal of an unnecessary portion of the metal layer by photolithography. The photolithography also removes the metal layer formed in a region where the insulating portion 17a is to be formed. When the metal layer in the region where the insulating portion 17a is to be formed is removed, the metal layer in a portion surrounded by the region where the insulating portion 17a is to be formed remains in an isolated island-like shape, so as to serve as the simulated electrode 16a. Then, an insulating material is filled in the region where the insulating portion 17a is to be formed by sputtering or the like, so that the insulating portion 17a is formed. In the above-described manner, the electrically discontinuous portion 18a is formed.

Figure 9:
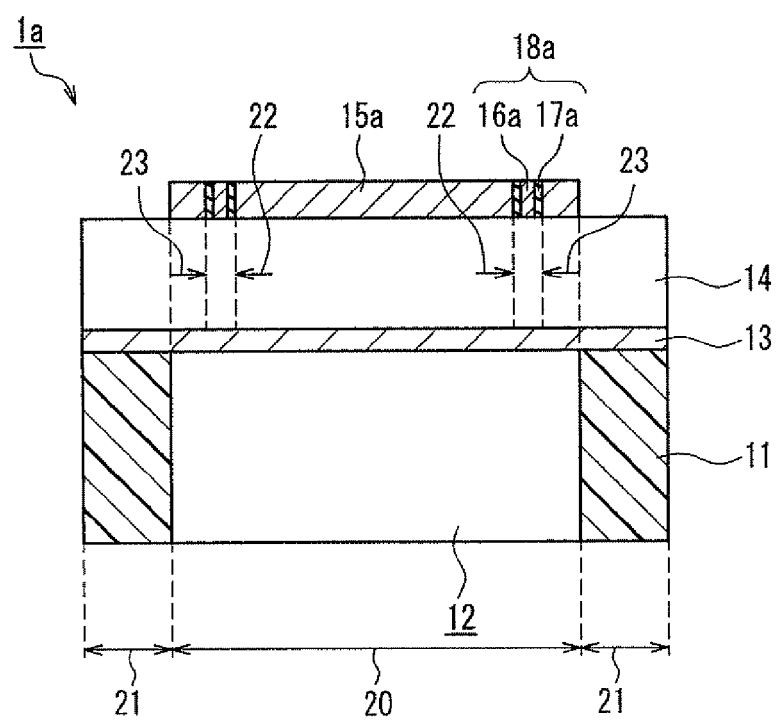
FIG. 9 is a cross-sectional view of the FBAR according to Embodiment 1 of the present application, illustrating transverse waves during operation.

Next, an operation of the FBAR 1a will be described. When a predetermined high-frequency voltage is applied between the lower electrode 13 and the upper electrode 15a, piston mode waves are generated in the piezoelectric film 14 in the resonance region 20. In addition, waves (i.e., transverse waves) that propagate in a direction (in FIG. 8B, a horizontal direction) vertical to the direction normal to the surface of the upper electrode 15a are generated. FIG. 9 is a cross-sectional view of the FBAR 1a, illustrating the transverse waves during operation. In order to illustrate transverse waves 22 and 23, the piezoelectric film 14 is not hatched. Further, in order to illustrate the transverse waves 23, the electrically discontinuous portion 18a is displaced from the position illustrated in FIG. 8B.

Since the electrically discontinuous portion 18a is not subjected to the high-frequency voltage, no wave is generated in the piezoelectric film 14 below the electrically discontinuous portion 18a. As illustrated in FIG. 9, in the piezoelectric film 14 below the electrically discontinuous portion 18a, the transverse waves 22 and 23 that have propagated from both sides cancel each other. Accordingly, the transverse waves are decreased, resulting in a reduction in spurious due to the transverse mode waves.

Figure 10A:
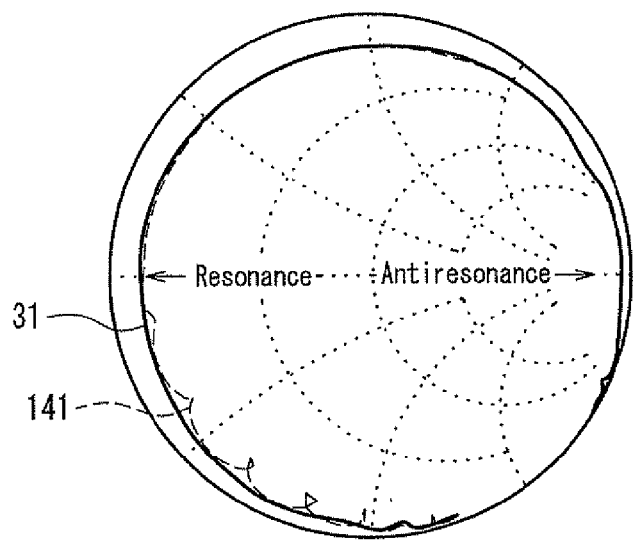
FIG. 10A is a Smith chart illustrating complex impedance characteristics of the FBAR according to Embodiment 1 of the present application.
Figure 10B:
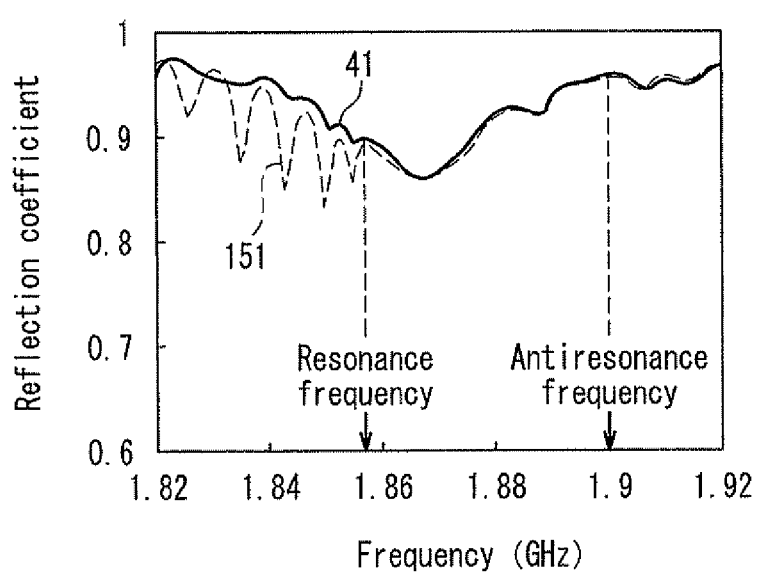
FIG. 10B is a graph illustrating frequency characteristics of a reflection coefficient of the FBAR according to Embodiment 1 of the present application.

FIG. 10A is a Smith chart illustrating complex impedance characteristics 31 of the FBAR 1a. FIG. 10B is a graph illustrating frequency characteristics 41 of a reflection coefficient of the FBAR 1a. In FIGS. 10A and 10B, the characteristics 141 and 151 of the conventional FBAR 101a illustrated in FIG. 1 also are indicated by broken lines for comparison. As can be seen from FIGS. 10A and 10B, the spurious is reduced at frequencies not higher than 1.86 GHz in the FBAR 1a as compared with the conventional FBAR 101a.

Figure 11:
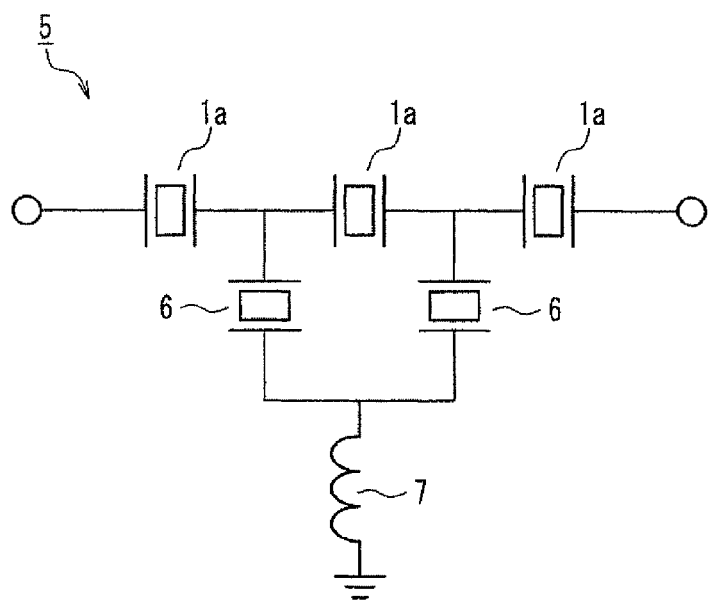
FIG. 11 is a circuit diagram illustrating a ladder-type filter according to Embodiment 1 of the present application.

FIG. 11 is a circuit diagram illustrating a configuration of a ladder-type filter 5 in which the FBARs 1a (first FBARs 1a) are arranged in a serial arm. In the ladder-type filter 5, the first FBARs 1a are arranged in the serial arm, and second FBARs 6, each having a different resonance frequency from the first FBAR 1a, are arranged in a parallel arm. The second FBARs 6 are grounded via a coil 7. When the resonance frequency of the first FBAR 1a is set to be substantially equal to an antiresonance frequency of the second FBAR 6, the ladder-type filter 5 exhibits insertion loss characteristics 51 illustrated in FIG. 12.

Figure 12:
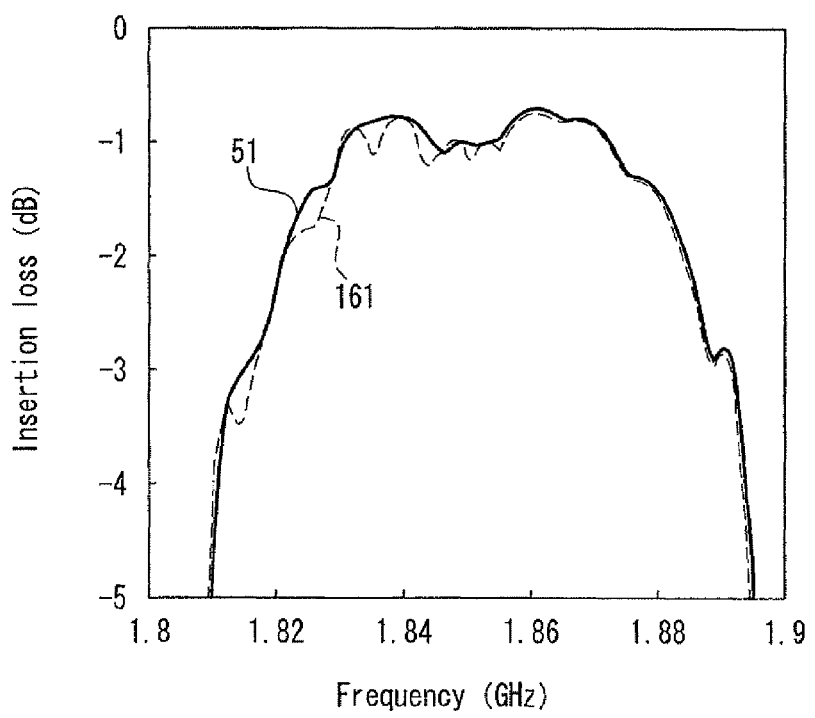
FIG. 12 is a graph illustrating insertion loss frequency characteristics of the filter using the FBAR according to Embodiment 1 of the present application.

In FIG. 12, the insertion loss characteristics 161 of the conventional ladder-type filter illustrated in FIG. 4 are indicated by a broken line for comparison with the characteristics 51. As can be seen from FIG. 12, the characteristics 51 of the ladder-type filter 5 show a reduction in spurious in a frequency band of 1.82 to 18.6 GHz as compared with the characteristics 161 (FIG. 4). Further, the ladder-type filter 5 exhibits the same characteristics as the filter using the conventional FBAR 101a at higher frequencies (1.86 to 1.88 GHz) of the passband, showing no reduction in insertion loss.

Next, a description will be given of an appropriate range of a distance g from the end of the resonance region 20 to the electrically discontinuous portion 18a illustrated in FIG. 8B.

Figure 13A:
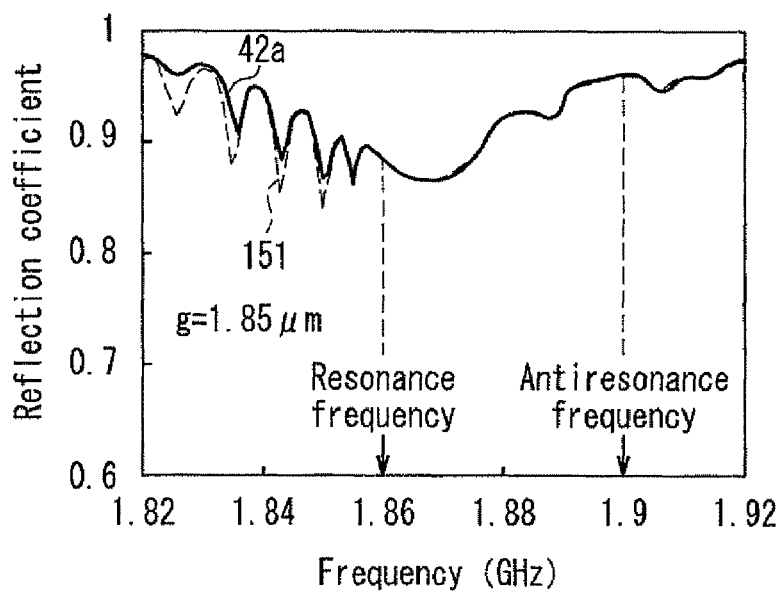
FIG. 13A is a graph illustrating frequency characteristics of a reflection coefficient of the FBAR according to Embodiment 1 of the present application in the case where a distance g is 1.85 μm.
Figure 13B:
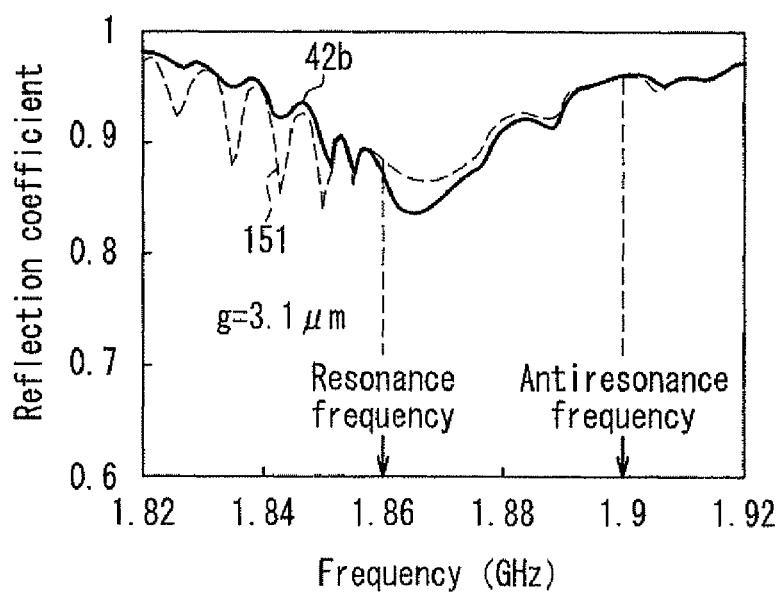
FIG. 13B is a graph illustrating frequency characteristics of a reflection coefficient of the FBAR according to Embodiment 1 of the present application in the case where the distance g is 3.1 μm.
Figure 13C:
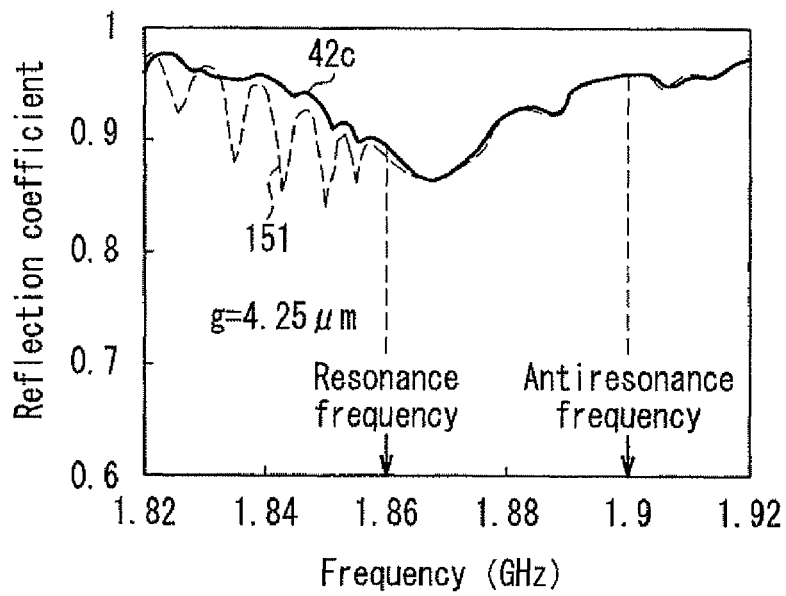
FIG. 13C is a graph illustrating frequency characteristics of a reflection coefficient of the FBAR according to Embodiment 1 of the present application in the case where the distance g is 4.25 μm.
Figure 13D:
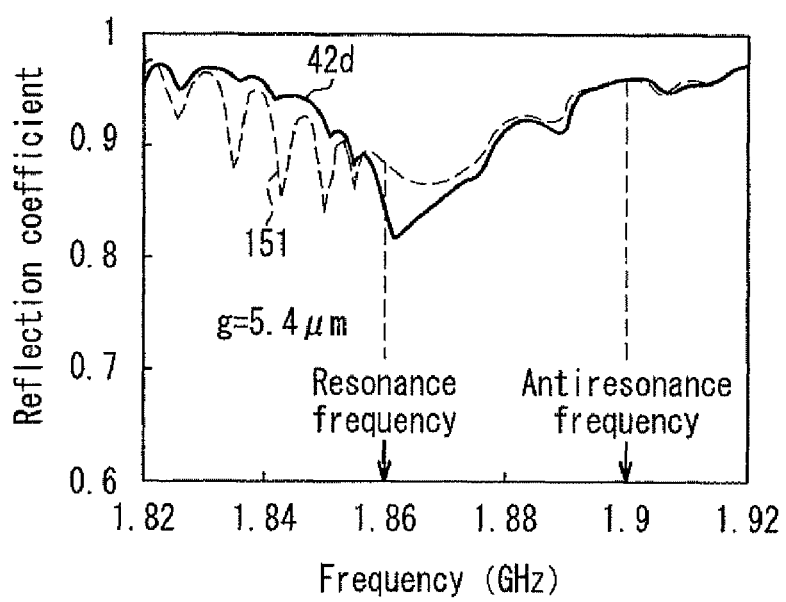
FIG. 13D is a graph illustrating frequency characteristics of a reflection coefficient of the FBAR according to Embodiment 1 of the present application in the case where the distance g is 5.4 μm.
Figure 13E:
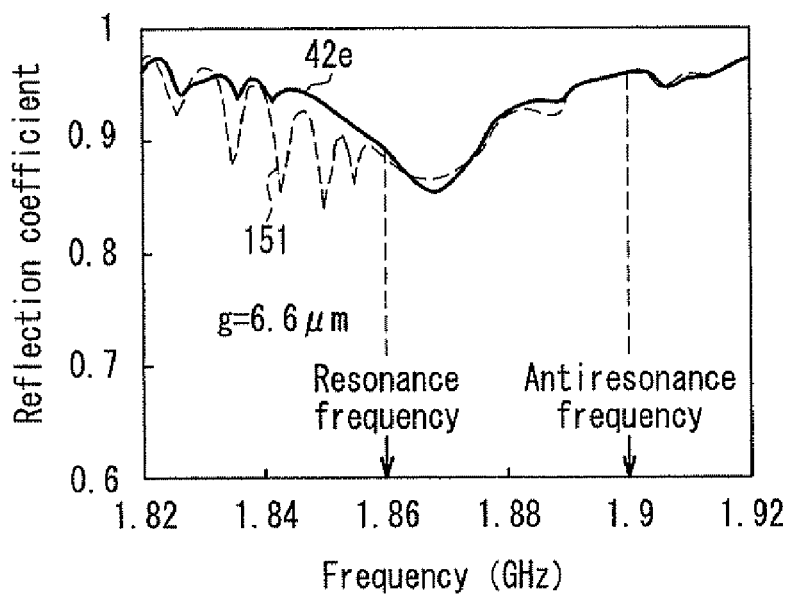
FIG. 13E is a graph illustrating frequency characteristics of a reflection coefficient of the FBAR according to Embodiment 1 of the present application in the case where the distance g is 6.6 μm.
Figure 13F:
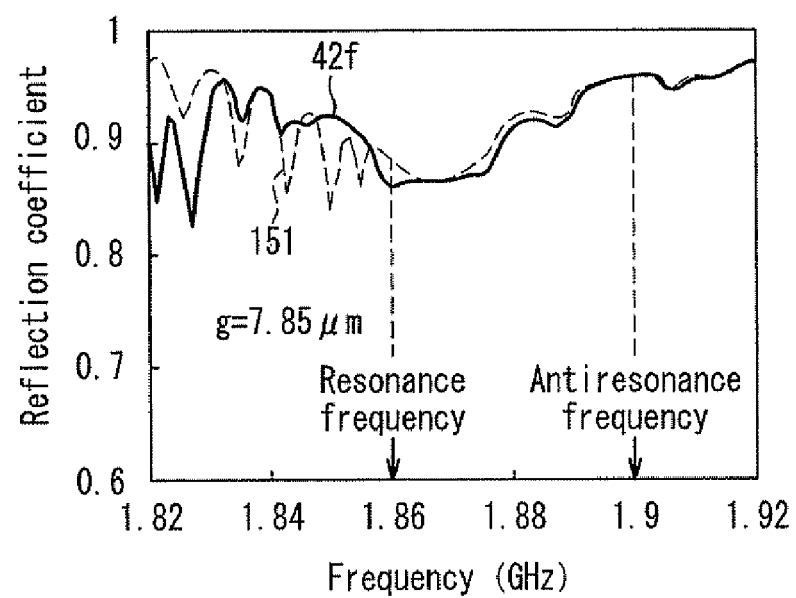
FIG. 13F is a graph illustrating frequency characteristics of a reflection coefficient of the FBAR according to Embodiment 1 of the present application in the case where the distance g is 7.85 μm.
Figure 13G:
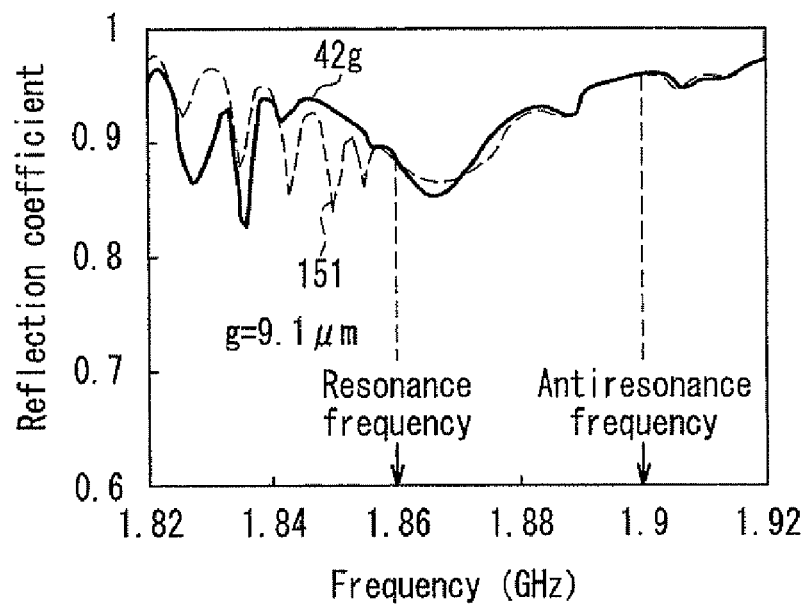
FIG. 13G is a graph illustrating frequency characteristics of a reflection coefficient of the FBAR according to Embodiment 1 of the present application in the case where the distance g is 9.1 μm.
Figure 13H:
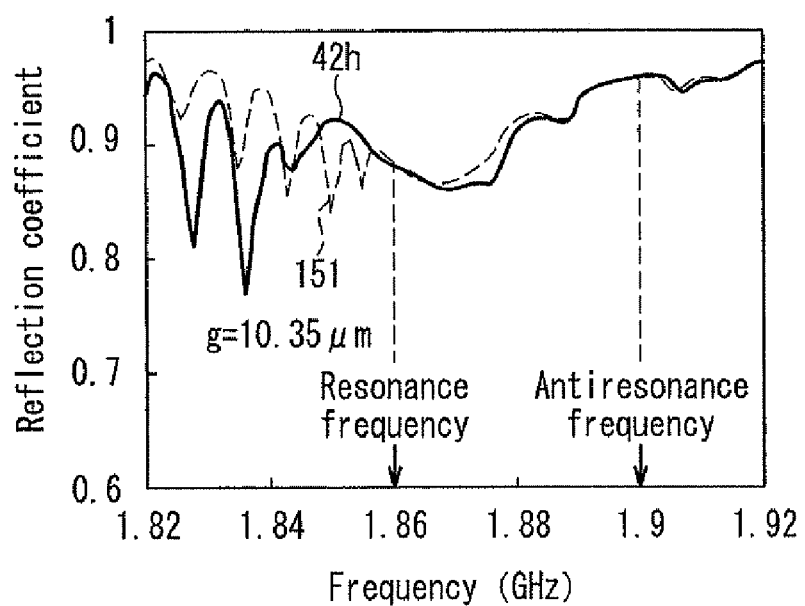
FIG. 13H is a graph illustrating frequency characteristics of a reflection coefficient of the FBAR according to Embodiment 1 of the present application in the case where the distance g is 10.35 μm.

FIGS. 13A to 13H are graphs illustrating frequency characteristics of respective reflection coefficients in the case where the distance g from the end of the resonance region 20 to the electrically discontinuous portion 18a illustrated in FIG. 8B is changed gradually from 1.85 µm to 10.35 µm, when a width w of the electrically discontinuous portion 18a is set to 1.2 µm. FIG. 13A illustrates characteristics 42a in the case where the distance g is 1.85 µm, FIG. 13B illustrates characteristics 42b in the case where the distance g is 3.1 µm, FIG. 13C illustrates characteristics 42c in the case where the distance g is 4.25 µm, and FIG. 13D illustrates characteristics 42d in the case where the distance g is 5.4 µm. Further, FIG. 13E illustrates characteristics 42e in the case where the distance g is 6.6 µm, and FIG. 13F illustrates characteristics 42f in the case where the distance g is 7.85 µm. Further, FIG. 13G illustrates characteristics 42g in the case where the distance g is 9.1 µm, and FIG. 13H illustrates characteristics 42h in the case where the distance g is 10.35 µm.

The characteristics illustrated in FIGS. 13A to 13H can be obtained by using general-purpose piezoelectric analysis software as used for calculating the characteristics 151 in FIG. 3B. In each of the graphs, the frequency characteristics 151 of the reflection coefficient of the conventional FBAR 101a illustrated in FIG. 3B are indicated by a broken line for comparison. The characteristics 42a to 42f illustrated in FIGS. 13A to 13F show a reduction in spurious as compared with the characteristics 151 of the conventional FBAR 101a. Further, the characteristics 42a to 42f show a greater reduction in spurious than the characteristics 42g and 42h. In other words, when the distance g is in a range of 1.85 µm to 7.85 µm, the spurious can be reduced more effectively.

The above calculation is carried out assuming that the piston mode waves have a wavelength $\lambda$ of 2.3 µm. Thus, the appropriate range of the distance g from the end of the resonance region 20 to the electrically discontinuous portion 18a illustrated in FIG. 8B is $0<g<3\lambda$. This appropriate range is satisfied even when w and $\lambda$ vary. It should be noted that the wavelength $\lambda$ of the piston mode waves can be obtained as follows: $\lambda=v/f$, where v denotes a sound velocity and f denotes a frequency.

If the width w of the electrically discontinuous portion 18a becomes larger than the wavelength $\lambda$ of the piston mode waves, the acoustic characteristics of the piezoelectric film 14 may vary below the electrically discontinuous portion 18a, causing the transverse waves to be reflected. To avoid this, the width w of the electrically discontinuous portion 18a is preferably in a range of $0<w<\lambda$.

By configuring the FBAR 1a as described above, the transverse mode waves are decreased, resulting in a reduction in spurious in the reflection coefficient. Accordingly, the ladder-type filter 5 using the first FBAR 1a illustrated in FIG. 11 can achieve a reduction in spurious while maintaining the characteristics at higher frequencies of the passband.

In the present embodiment, the simulated electrode 16a is made of the same material as the upper electrode 15a. However, the material of the simulated electrode 16a is not limited thereto, and another metal, an insulating material, or the like may be used. When the simulated electrode 16a is made of a material different from that of the upper electrode 15a, the simulated electrode 16a preferably has the same surface density as the upper electrode 15a so that the piezoelectric film 14 has the same acoustic characteristics below the simulated electrode 16a and below the upper electrode 15a. When the piezoelectric film 14 has the same acoustic characteristics below the simulated electrode 16a and below the upper electrode 15a located on both sides of the simulated electrode 16a, the transverse waves cancel each other more easily in the piezoelectric film 14 below the electrically discontinuous portion 18a, resulting in an increased spurious reduction effect.

Further, it is preferable that the material of the simulated electrode 16a has substantially the same density as the upper electrode 15a. This allows a top surface of the simulated electrode 16a to be arranged in the same plane as a top surface of the upper electrode 15a, making it possible to form a dielectric film or the like on the plane without forming a flattening film.

Further, it is not necessarily required that the insulating portion 17a is made of an insulating material. The insulating portion 17a may be formed of a gap, as long as it prevents conduction between the simulated electrode 16a and the upper electrode 15a.

Figure 14:
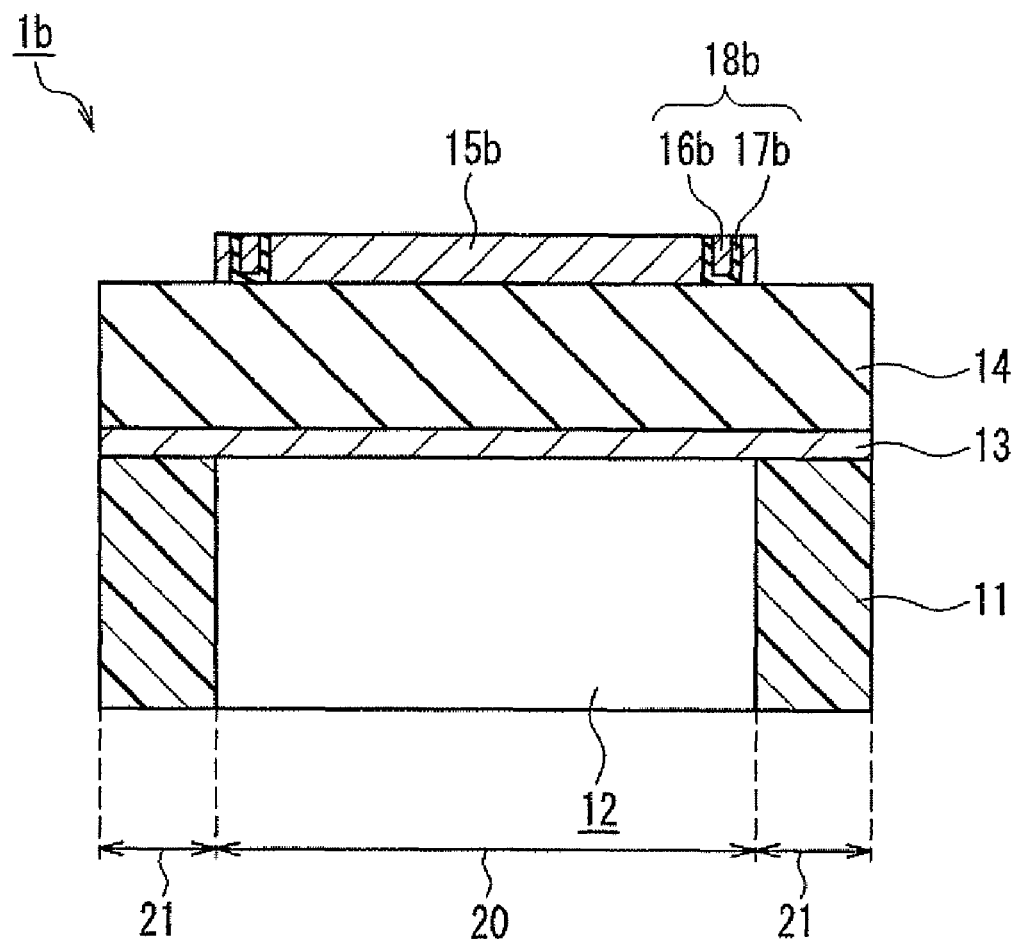
FIG. 14 is a cross-sectional view illustrating another configuration of the FBAR according to Embodiment 1 of the present application.

In addition, a FBAR 1b illustrated in FIG. 14 that includes an electrically discontinuous portion 18b as a modification of the electrically discontinuous portion 18a also can achieve the spurious reduction effect similarly. FIG. 14 is a cross-sectional view illustrating a configuration of the FBAR 1b as a modification of the present embodiment. The electrically discontinuous portion 18b includes a simulated electrode 16b and an insulating portion 17b that insulates the simulated electrode 16b from an upper electrode 15b. The insulating portion 17b also is formed at a boundary between the simulated electrode 16b and the piezoelectric film 14.

When the FBAR 1a illustrated in FIG. 8B uses a higher frequency, in order to satisfy $0<w<\lambda$, it is preferred to narrow the electrically discontinuous portion 18a, which makes the insulating portion 17a narrower as well. However, it is difficult to form the insulating portion 17a with a narrower width by etching or the like during the above-described process for forming the electrically discontinuous portion 18a. On the other hand, the electrically discontinuous portion 18b of the FBAR 1b illustrated in FIG. 14 is formed in the following manner. It should be noted that process steps other than the step described below are the same as those for the FBAR 1a, and thus descriptions thereof are omitted.

During a process for forming the upper electrode 15b, a pattern of the upper electrode 15b is formed, and a metal layer formed in a region where the electrically discontinuous portion 18b is to be formed is removed by photolithography. Then, the insulating portion 17b is formed in a film shape on a bottom surface of the region where the electrically discontinuous portion 18b is to be formed and side surfaces of the upper electrode 15b to be in contact with the electrically discontinuous portion 18b by sputtering or the like. Thereafter, a metal material is deposited on the insulating portion 17b formed on the bottom surface of the region where the electrically discontinuous portion 18b is to be formed, so that the simulated electrode 16b is formed. In this manner, the electrically discontinuous portion 18b can be formed also for the FBAR for a higher frequency, which thus can achieve a reduction in spurious.

In the present embodiment, in the FBARs 1a and 1b, the electrically discontinuous portions 18a and 18b are provided in the upper electrodes 15a and 15b. However, the electrically discontinuous portions may be provided in the lower electrode 13 in the resonance region 20, or in the upper electrodes 15a and 15b and the lower electrode 13, respectively, in the resonance region 20 so as to be opposed to each other.

In the FBARs 1a and 1b, the resonance region 20 may have a circular shape or a polygonal shape with an even number of angles, such as a square shape. However, an elliptical shape or a polygonal shape with an odd number of angles, such as a pentangular shape, is preferable. When the resonance region 20 has an elliptical shape or a polygonal shape with an odd number of angles, the transverse waves propagate different distances, preventing waves having a predetermined wavelength from being strengthened mutually, so that spurious is less likely to occur. Combined with the effect of canceling the transverse waves in the electrically discontinuous portion, spurious can be reduced further.

In the present embodiment, the gap 12 has the same area as the resonance region 20 in a plane direction of the substrate 11. However, the gap 12 may have a larger area than the resonance region 20. With this configuration, a preferable Q value is obtained at resonance and antiresonance.

(Embodiment 2)

Figure 15A:
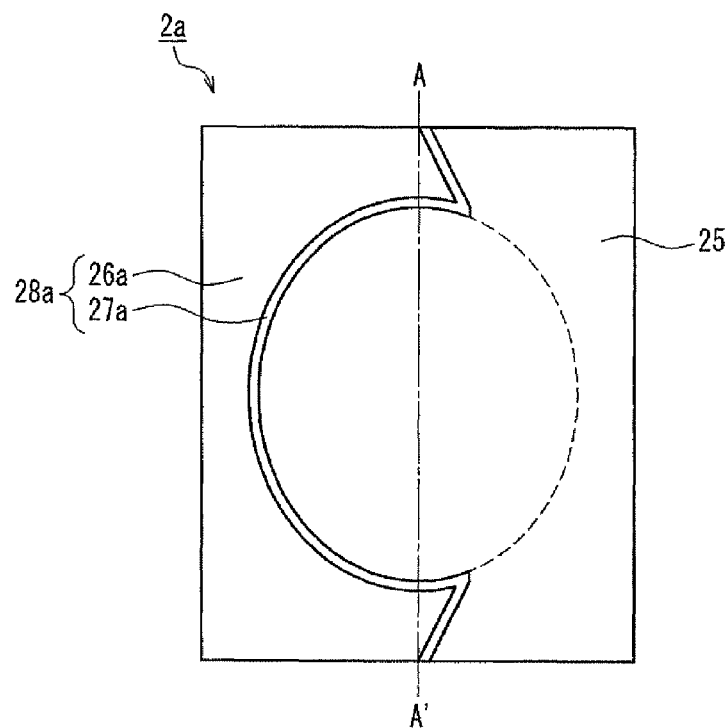
FIG. 15A is a plan view illustrating a configuration of a FBAR according to Embodiment 2 of the present application.
Figure 15B:
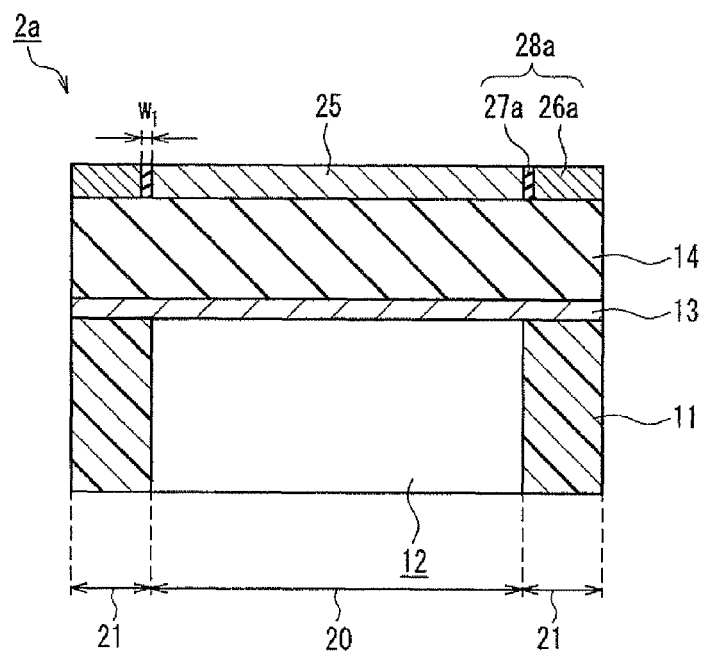
FIG. 15B is a cross-sectional view illustrating the configuration of the FBAR according to Embodiment 2 of the present application, taken along a line A-A'.

FIG. 15A is a plan view illustrating a configuration of a FBAR 2a according to Embodiment 2 of the present application. FIG. 15B is a cross-sectional view taken along a line A-A' in FIG. 15A. In the FBAR 2a, an electrically discontinuous portion 28a is formed outside an upper electrode 25. In the FBAR 2a, the same components as those of the FBAR 1a are denoted with the same reference numerals, and descriptions thereof are omitted.

Figure 15C:
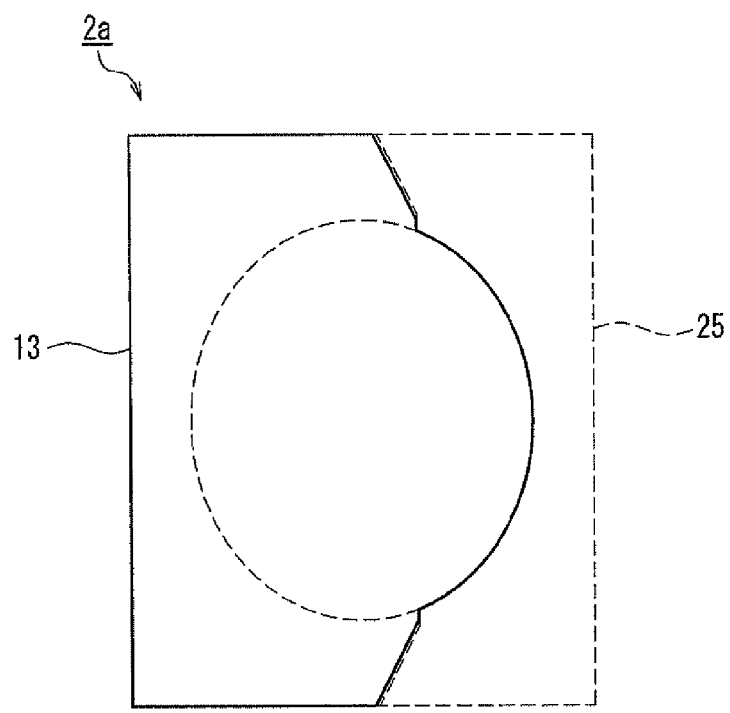
FIG. 15C is a view illustrating a positional relationship between an upper electrode and a lower electrode of the FBAR according to Embodiment 2 of the present application.

FIG. 15C is a plan view of the FBAR 2a illustrated in FIG. 15A, illustrating a state where the electrically discontinuous portion 28a and the piezoelectric film 14 are removed so as to illustrate the shape of the lower electrode 13. The shape of the upper electrode 25 is indicated by a broken line. An outer circumference of the lower electrode 13 includes a portion formed in an elliptic arc shape. The elliptic arc portion on the outer circumference overlaps the upper electrode 25 via the piezoelectric film 14. This elliptical overlapping region serves as the resonance region 20.

As illustrated in FIG. 15B, the upper electrode 25 is formed on the piezoelectric film 14. The electrically discontinuous portion 28a, which is insulated from the upper electrode 25, is formed in a region (non-resonance region 21) on the piezoelectric film 14 where the upper electrode 25 is not formed. The electrically discontinuous portion 28a includes a simulated electrode 26a and an insulating portion 27a. In other words, the upper electrode 25 and the simulated electrode 26a are insulated from each other by the insulating portion 27a. The simulated electrode 26a is made of the same type of metal as the upper electrode 25a and formed to have the same thickness as the upper electrode 25. This allows the upper electrode 25 and the simulated electrode 26a to have substantially the same surface density. With this configuration, the piezoelectric film 14 can have the same acoustic characteristics below the simulated electrode 26a and below the upper electrode 25.

The insulating portion 27a preferably is formed to have a width w1 illustrated in FIG. 15B in a range of $0<w1<\lambda$, so that transverse waves are less reflected from a boundary between the resonance region 20 and the non-resonance region 21.

The FBAR 2a illustrated in FIG. 15B is manufactured in the same manner as a conventional FBAR except for an additional process for forming the electrically discontinuous portion 28a. The following description is directed to the process for forming the electrically discontinuous portion 28a. A metal layer is formed on an entire top surface of the piezoelectric film 14, followed by the removal of the metal layer in a region where the insulating portion 27a is to be formed, by photolithography. A part of the remaining metal layer serves as the upper electrode 25, and the rest servers as the simulated electrode 26a. Then, an insulating material is filled in the region where the insulating portion 27a is to be formed by sputtering or the like, so that the insulating portion 27a is formed. In the above-described manner, the electrically discontinuous portion 28a is formed.

Figure 16:
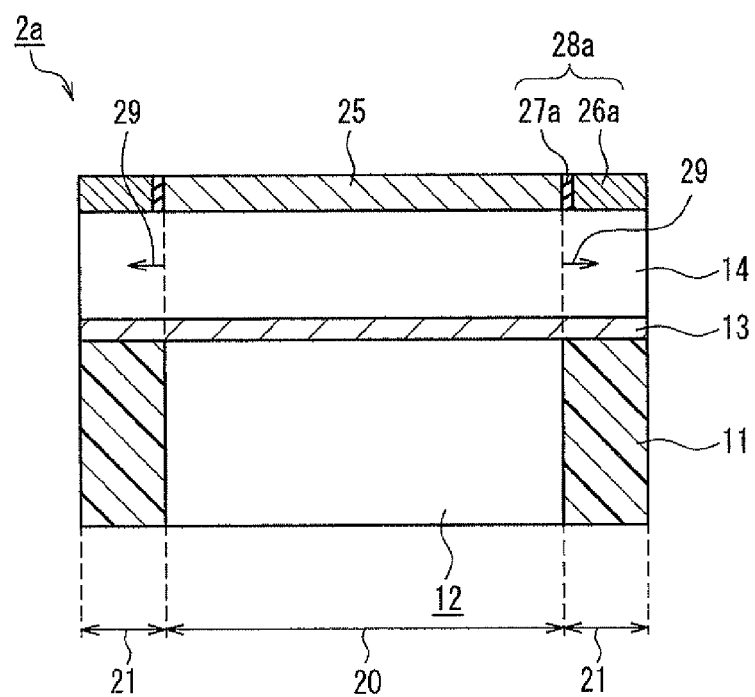
FIG. 16 is a cross-sectional view of the FBAR according to Embodiment 2 of the present application, illustrating transverse waves when a high-frequency voltage is applied to the FBAR.

Next, an operation of the FBAR 2a will be described. FIG. 16 is a cross-sectional view of the FBAR 2a, illustrating transverse waves when a high-frequency voltage is applied to the FBAR 2a. In order to illustrate transverse waves 29, the piezoelectric film 14 is not hatched. When a predetermined high-frequency voltage is applied between the lower electrode 13 and the upper electrode 25, piston mode waves (not illustrated) that propagate in a direction normal to a surface of the upper electrode 25 are generated in the piezoelectric film 14 in the resonance region 20. In addition, the transverse waves 29 that propagate in a direction vertical to the direction normal to the surface of the upper electrode 25 are generated. Since the simulated electrode 26a is formed in the non-resonance region 21, the piezoelectric film 14 has the same acoustic characteristics in the resonance region 20 and in the non-resonance region 21. Thus, the transverse waves 29 generated in the resonance region 20 propagate to the non-resonance region 21 without being reflected from the boundary between the resonance region 20 and the non-resonance region 21, and are attenuated. As a result, standing waves (transverse mode) due to the transverse waves 29 are decreased in the resonance region 20 as compared with the conventional FBAR 101a illustrated in FIG. 2.

Figure 17A:
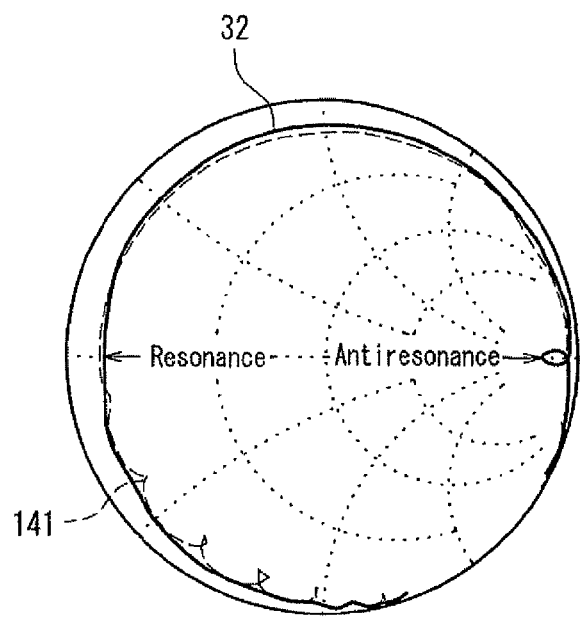
FIG. 17A is a Smith chart illustrating complex impedance characteristics of the FBAR according to Embodiment 2 of the present application.
Figure 17B:
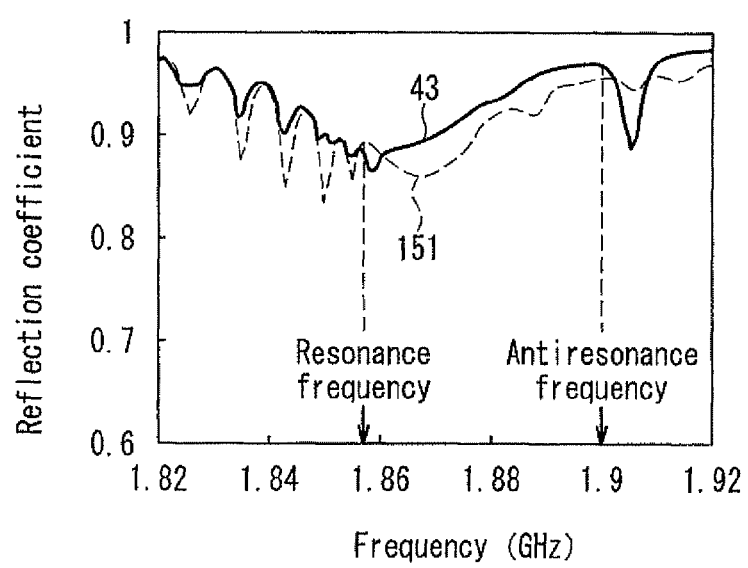
FIG. 17B is a graph illustrating frequency characteristics of a reflection coefficient of the FBAR according to Embodiment 2 of the present application.

FIG. 17A is a Smith chart illustrating complex impedance characteristics 32 of the FBAR 2a. FIG. 17B is a graph illustrating frequency characteristics 43 of a reflection coefficient of the FBAR 2a. In FIGS. 17A and 17B, the characteristics 141 and 151 of the conventional FBAR 101a illustrated in FIGS. 3A and 3B also are indicated by broken lines for comparison. As can be seen from FIGS. 17A and 17B, the characteristics 32 and 43 of the FBAR 2a show a reduction in spurious as compared with the characteristics 141 and 151 of the conventional FBAR 101a. Further, the characteristics 32 and 43 of the FBAR 2a do not show a decrease in reflection coefficient. In other words, the resonance characteristics of the FBAR 2a achieve a reduction in spurious due to the transverse mode waves at lower frequencies, while maintaining the characteristics 141 and 151 of the conventional FBAR 101a at higher frequencies.

Figure 18:
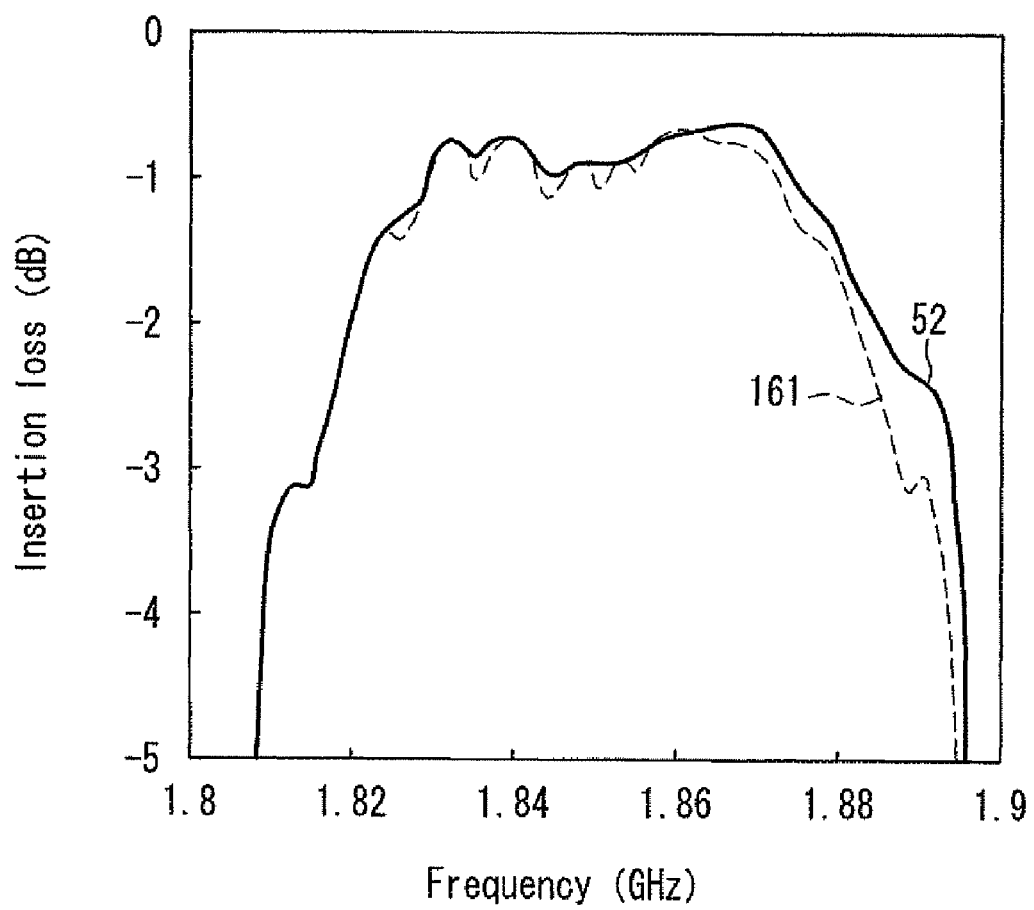
FIG. 18 is a graph illustrating insertion loss frequency characteristics of a filter using the FBAR according to Embodiment 2 of the present application.

FIG. 18 is a graph illustrating insertion loss frequency characteristics 52 of a filter using the FBAR 2a with the characteristics illustrated in FIG. 17A instead of the first FBAR 1a in the ladder-type filter 5 illustrated in FIG. 11. It can be seen that the spurious is reduced as compared with the characteristics 161 (indicated by a broken line) of the filter using the conventional FBAR 101a as illustrated in FIG. 4. Accordingly, it is possible to keep an EVM low. Further, it is possible to expand a frequency band at higher frequencies of a passband as compared with the filter using the conventional FBAR 101a.

Figure 19:
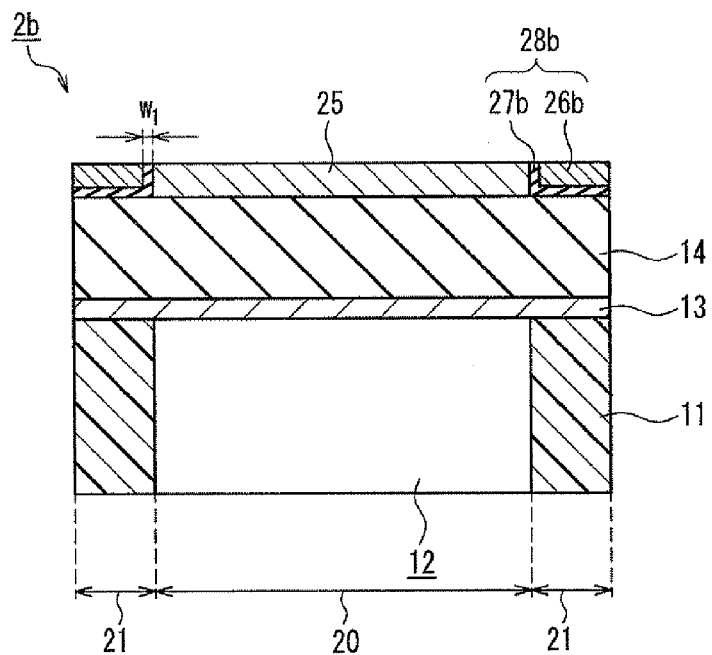
FIG. 19 is a cross-sectional view illustrating another configuration of the FBAR according to Embodiment 2 of the present application.

As a modification of the electrically discontinuous portion 28a, it is possible to use an electrically discontinuous portion 28b illustrated in FIG. 19. FIG. 19 is a cross-sectional view illustrating a configuration of a FBAR 2b as a modification of the present embodiment. The electrically discontinuous portion 28b includes a simulated electrode 26b and an insulating portion 27b that insulates the simulated electrode 26b from the upper electrode 25. The insulating portion 27b also is formed at a boundary between the simulated electrode 26b and the piezoelectric film 14.

When the FBAR 2a illustrated in FIG. 15B uses a higher frequency, in order to allow the width w1 of the insulating portion 27a to be in a range of $0<w1<\lambda$, it is preferred to narrow the insulating portion 27a. However, it is difficult to form the insulating portion 27a with a narrower width by etching or the like during the above-described process for forming the electrically discontinuous portion 28a. On the other hand, the FBAR 2b illustrated in FIG. 19 is formed in the following manner. It should be noted that process steps other than the step described below are the same as those for the FBAR 2a, and thus descriptions thereof are omitted.

A metal layer formed in a region where the electrically discontinuous portion 28b is to be formed is removed by photolithography. The metal layer remaining after the photolithography serves as the upper electrode 25. Then, the insulating portion 27b is formed in a film shape on a bottom surface of the region where the electrically discontinuous portion 28b is to be formed and a side surface of the upper electrode 25 by sputtering or the like. Thereafter, a metal material is deposited on the insulating portion 27b formed on the bottom surface of the region where the electrically discontinuous portion 28b is to be formed, so that the simulated electrode 26b is formed. In this manner, the electrically discontinuous portion 28b is formed.

In the FBARs 2a and 2b, the simulated electrodes 26a and 26b are made of the same type of metal as the upper electrode 25. However, it is not necessarily required to use the same type of metal, as long as the simulated electrodes 26a and 26b have substantially the same surface density as the upper electrode 25. When the simulated electrodes 26a and 26b have substantially the same surface density, the piezoelectric film has substantially the same acoustic characteristics below the simulated electrodes 26a and 26b and in the resonance region 20. Accordingly, the transverse waves are carried to the non-resonance region 21 easily, resulting in a spurious reduction effect.

In addition, when the simulated electrodes 26a and 26b are made of a material having substantially the same density as a metal of the upper electrode 25, a top surface of the simulated electrodes 26a and 26b can be arranged in the same plane as a top surface of the upper electrode 25. Thus, in the case of further forming a dielectric film or the like on the plane, it is not necessary to form a flattening film or the like.

Figure 20:
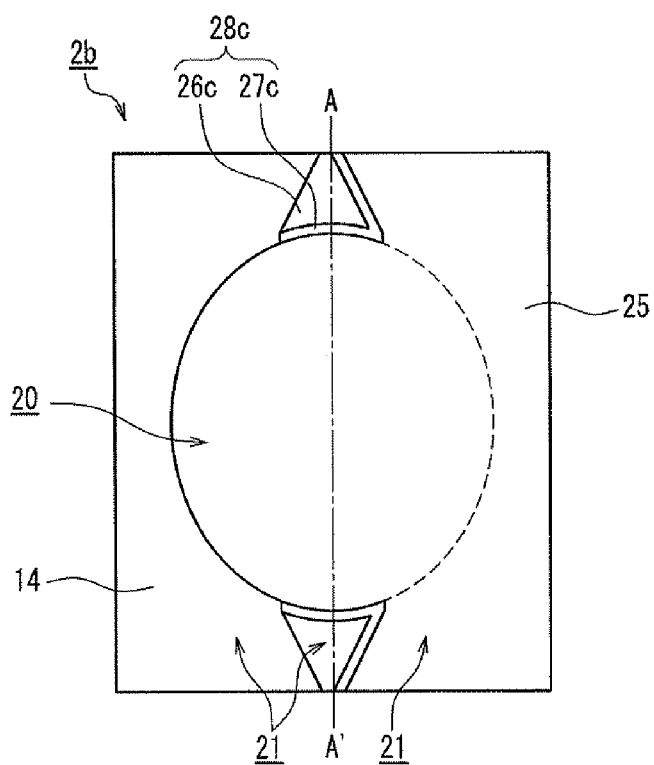
FIG. 20 is a plan view illustrating the other configuration of the FBAR according to Embodiment 2 of the present application.

Further, it is not necessarily required that the electrically discontinuous portions 28a and 28b are formed so as to entirely cover a region opposed to the lower electrode 13. FIG. 20 is a plan view illustrating an exemplary electrically discontinuous portion 28c that is formed only in a part of the non-resonance region 21. An insulating portion 27c is formed in contact with the upper electrode 25 in the resonance region 20, and a simulated electrode 26c is formed so as to be insulated from the upper electrode 25 by the insulating portion 27c. In this manner, even when the electrically discontinuous portion 28c is formed so as to be opposed only to a part of the lower electrode 13 in the non-resonance region 21, the occurrence of spurious can be reduced corresponding to any transverse waves that propagate to the non-resonance region 21.

Further, in the piezoelectric thin film resonators 1a, 1b, 2a, and 2b, the lower electrode 13 and the upper electrodes 15a, 15b, and 25 can be made of aluminium (Al), copper (Cu), molybdenum (Mo), tungsten (W), tantalum (Ta), platinum (Pt), ruthenium (Ru), rhodium (Rh), iridium (Ir), or the like. It is preferable that at least one of the lower electrode 13 and the upper electrodes 15a, 15b, and 25 includes a Ru film. Since Ru is a material with high acoustic impedance, it is possible to realize a resonator with a preferable Q value.

Further, the piezoelectric film 14 can be made of aluminium nitride (AIN), zinc oxide (ZnO), lead zirconate titanate (PZT), lead titanate (PbTiO$_3$), or the like. In particular, AIN is preferable for the piezoelectric film 14, since AIN is a material that allows acoustic waves to propagate therethrough at a high speed as compared with the other piezoelectric film materials, making it possible to realize a resonator with a preferable Q value. Further, the substrate 11 can be made of silicon, glass, or the like.

Further, in the above-described FBARs 1a, 1b, 2a, and 2b, the lower electrode 13 is provided over the gap 12 that penetrates the substrate 11 in the resonance region 20. However, the configuration of the FBARs 1a, 1b, 2a, and 2b is not limited thereto. For example, a concave hole may be formed on a surface of the substrate 11 that contacts the lower electrode 13 such that the lower electrode 13 covers the hole in the resonance region 20.

Further, the FBARs 1a, 1b, 2a, and 2b shown in Embodiments 1 and 2 may include an acoustic multilayer film instead of the gap 12 in the substrate 11, which results in the same effect as the FBARs. This configuration is called a SMR.

Although only the main portions of the FBARs 1a, 1b, 2a, and 2b are described in Embodiments 1 and 2, other members may be provided. For example, a dielectric film may be provided under the lower electrode 13 for reinforcement or as an etching stop layer. Further, a passivation film or a dielectric film for frequency adjustment may be provided on the upper electrodes 15a, 15b, and 25.

(Embodiment 3)

Figure 21:
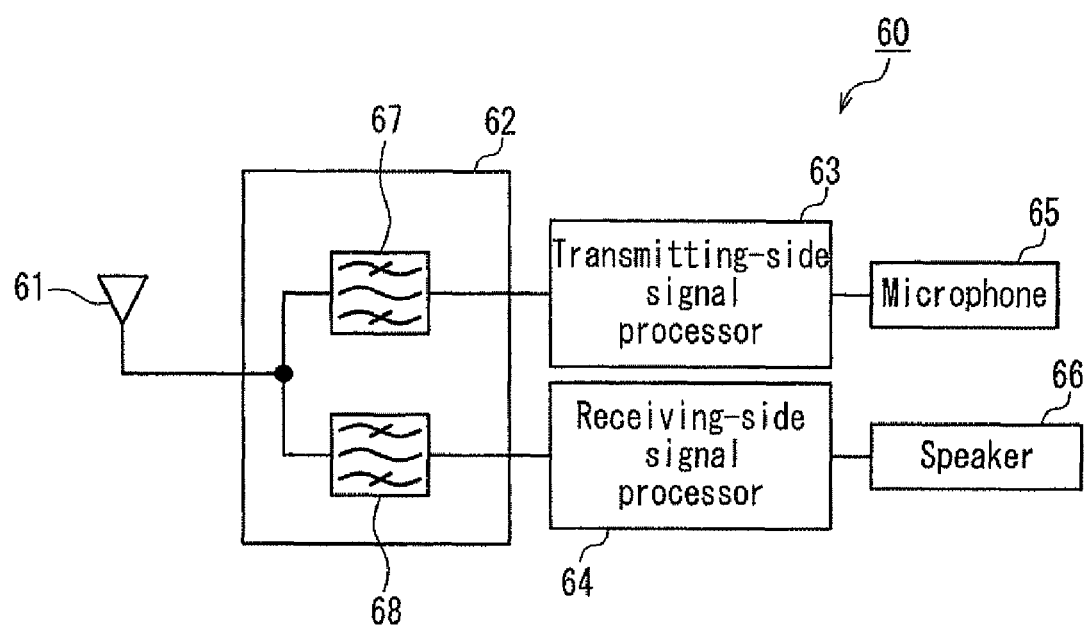
FIG. 21 is a view illustrating a configuration of communication equipment according to Embodiment 3 of the present application.

FIG. 21 is a view illustrating a configuration of communication equipment 60 according to Embodiment 3 of the present application. The communication equipment 60 includes an antenna 61, a duplexer 62, a transmitting-side signal processor 63, a receiving-side signal processor 64, a microphone 65, and a speaker 66. The duplexer 62 includes a transmission filter 67 using the FBAR 1a, 1b, 2a, or 2b in Embodiment 1 or 2 and a reception filter 68. The reception filter 68 has a passband (reception band) different from that of the transmission filter 67.

The microphone 65 converts voice into a voice signal, and inputs the voice signal to the transmitting-side signal processor 63. The transmitting-side signal processor 63 modulates the voice signal to generate a transmission signal. The duplexer 62 inputs the transmission signal generated by the transmitting-side signal processor 63 to the antenna 61.

The antenna 61 converts the transmission signal into a radio wave, and outputs the same. Further, the antenna 61 converts a radio wave into a reception signal as an electric signal, and inputs the reception signal to the duplexer 62. In the duplexer 62, the reception filter 68 allows a reception signal in the reception band to pass therethrough, and inputs the same to the receiving-side signal processor 64. On the other hand, the transmission filter 67, which has a passband different from the reception band, does not allow the reception signal to pass therethrough. Thus, the reception signal is not input to the transmitting-side signal processor 63. The receiving-side signal processor 64 subjects the reception signal to processing such as detection and amplification, and generates a voice signal. The speaker 66 converts the voice signal into voice, and outputs the same.

As the transmission filter 67 and the reception filter 68, the ladder-type filter 5 illustrated in FIG. 11 can be used. When the ladder-type filter 5 is used, the effect of spurious is reduced, resulting in a lower EVM as illustrated in FIG. 12. Accordingly, it is possible to reduce a power loss for the transmission signal caused by the transmission filter 67 and a power loss for the reception signal caused by the reception filter 68. By using the duplexer 62 including the transmission filter 67 and the reception filter 68, it is possible to reduce a power loss of the communication equipment 60. As a result, it is possible, for example, to extend the life of the communication equipment 60 provided with a battery.

The communication equipment 60 includes the microphone 65 and the speaker 66. However, the configuration of the communication equipment 60 is not limited thereto. For example, the communication equipment 60 may not necessarily require the microphone 65 or the speaker 66 like a personal computer, for example, or may be configured to transmit and receive data other than voice data.

Further, the FBAR 1b, 2a or 2b may be used instead of the first FBAR 1a of the ladder-type filter 5 illustrated in FIG. 11, which results in the same effect.

The filter using the FBAR 1a, 1b, 2a, or 2b shown in Embodiment 1 or 2 is not limited to use in the duplexer 62 of the communication equipment 60.

In Embodiments 1 to 3, the ladder-type filter using the FBAR 1a, 1b, 2a or 2b has been exemplified. However, the FBAR 1a, 1b, 2a or 2b may be used in a lattice-type filter, for example, instead of the ladder-type filter, which results in the same effect.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has (have) been described in detail, it should be understood that the various changes, substitutions, and alterations could be made hereto without departing from the sprit and scope of the invention.

The piezoelectric thin film resonator of the present application achieves a reduction in spurious, and can be used in a filter, a duplexer, communication equipment, and the like.

The invention claimed is:

1. A piezoelectric thin film resonator comprising:
a piezoelectric film;
a first electrode formed on a first principal surface of the piezoelectric film; and
a second electrode formed on a second principal surface of the piezoelectric film opposite to the first principal surface,
the resonator having a resonance region where the first electrode and the second electrode are opposed to each other,
wherein an electrically discontinuous portion that is insulated from the first electrode is provided on the first principal surface of the piezoelectric film in the resonance region, and
the electrically discontinuous portion is surrounded by the first electrode on the first principal surface, and
wherein the electrically discontinuous portion comprises:
a simulated electrode; and
an insulating portion that insulates the first electrode from the simulated electrode.

2. The piezoelectric thin film resonator according to claim 1, wherein the piezoelectric film is made of AlN.

3. The piezoelectric thin film resonator according to claim 1, wherein the insulating portion is made of an insulating material.

4. The piezoelectric thin film resonator according to claim 1, wherein the insulating portion is formed of a gap.

5. The piezoelectric thin film resonator according to claim 1, wherein the simulated electrode has the same surface density as the first electrode.

6. The piezoelectric thin film resonator according to claim 5, wherein the simulated electrode has the same density as a material of the first electrode.

7. The piezoelectric thin film resonator according to claim 1, wherein the following expression is satisfied:

$0 < g < 3\lambda$, where g denotes a distance from an end of the resonance region to the electrically discontinuous portion, and $\lambda$ denotes a wavelength at a resonance frequency.

8. The piezoelectric thin film resonator according to claim 7, wherein the resonance region has an elliptical shape or a polygonal shape, and the electrically discontinuous portion is arranged inside the end of the resonance region by the distance g so as to form an elliptical shape.

9. The piezoelectric thin film resonator according to claim 1, wherein the following expression is satisfied:

$0 < w < \lambda$, where w denotes a width of the electrically discontinuous portion, and X denotes a wavelength at a resonance frequency.

10. The piezoelectric thin film resonator according to claim 1, wherein the first electrode and the second electrode are made of Ru.

11. A filter having a plurality of the piezoelectric thin film resonators according to claim 1.

12. A duplexer comprising:

a transmission filter; and a reception filter that allows a signal in a frequency band different from that of the transmission filter to pass therethrough, wherein the transmission filter and the reception filter have the filter according to claim 11.

13. Communication equipment comprising:

an antenna;

the duplexer according to claim 12 connected to the antenna; and a signal processor connected to the duplexer.

\* \* \* \* \*